(12) United States Patent
Zho et al.

(10) Patent No.: US 10,353,036 B2
(45) Date of Patent: Jul. 16, 2019

(54) MAGNETIC RESONANCE IMAGING APPARATUS AND METHOD OF CONTROLLING THE SAME

(71) Applicant: SAMSUNG ELECTRONICS CO., LTD., Suwon-si (KR)

(72) Inventors: Sang Young Zho, Suwon-si (KR); Jong Buhm Park, Seoul (KR); Sung Pil Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 171 days.

(21) Appl. No.: 15/386,663

(22) Filed: Dec. 21, 2016

(65) Prior Publication Data

US 2017/0176560 A1 Jun. 22, 2017

(30) Foreign Application Priority Data

Dec. 21, 2015 (KR) .......................... 10-2015-0183009

(51) Int. Cl.
*G01V 3/00* (2006.01)
*G01R 33/483* (2006.01)
*G01R 33/56* (2006.01)

(52) U.S. Cl.
CPC ..... *G01R 33/4838* (2013.01); *G01R 33/4833* (2013.01); *G01R 33/56* (2013.01); *G01R 33/5608* (2013.01)

(58) Field of Classification Search
CPC ............ G01R 33/5635; G01R 33/5602; G01R 33/5607; G01R 33/4824; G01R 33/4835;
(Continued)

(56) References Cited

U.S. PATENT DOCUMENTS 4,847,560 A 7/1989 Sattin
2013/0278258 A1 10/2013 Smith et al.
(Continued)

FOREIGN PATENT DOCUMENTS

JP 2001-120518 A 5/2001
JP 2005-125096 A 5/2005
(Continued)

OTHER PUBLICATIONS

Karlsen et al., "A Steady State Perfusion Experiment", Proceedings of the International Society for Magnetic Resonance in Medicine 4th Annual Meeting and Exhibition, New York, NY, USA, Apr. 27, 1996-May 3, 1996, vol. 4, Apr. 27, 1996, p. 1308, XP055363850.
(Continued)

*Primary Examiner* — Walter L Lindsay, Jr.
*Assistant Examiner* — Frederick Wenderoth
(74) *Attorney, Agent, or Firm* — Sughrue Mion, PLLC

(57) ABSTRACT

It is an aspect of the present disclosure to provide an MRI apparatus configured to and a method to acquire a sectional image of an object and implement a reduced Field of View (FOV) from which aliasing is removed by using a saturation pulse sequence that suppresses a magnetic resonance (MR) signal at a given position, and a method of controlling the same. An MRI apparatus may include: a sequence controller controlling a scanner to apply an unsaturation pulse sequence and a saturation pulse sequence to the object; and a data processor configured to acquire a first image by receiving an MR signal from the object to which the unsaturation pulse sequence is applied, acquire a second image by receiving an MR signal from the object to which the saturation pulse sequence is applied, and generate a difference image between the first image and the second image.

21 Claims, 24 Drawing Sheets

(58) Field of Classification Search
CPC ............ G01R 33/4838; G01R 33/5608; G01R 33/56509; G01R 33/24; G01R 33/543; G01R 33/5659; G01R 33/3415; G01R 33/36; A61B 5/055
See application file for complete search history.

(56) References Cited

U.S. PATENT DOCUMENTS

| | | | |
|---|---|---|---|
| 2013/0314086 A1* | 11/2013 | Li | G01R 33/56509 324/309 |
| 2014/0018666 A1* | 1/2014 | Koktzoglou | A61B 5/055 600/419 |
| 2014/0200436 A1* | 7/2014 | Weingartner | G01R 33/5602 600/413 |
| 2014/0232393 A1* | 8/2014 | Wheaton | G01R 33/24 324/309 |
| 2014/0378826 A1 | 12/2014 | Edelman | |
| 2015/0157238 A1 | 6/2015 | Edelman | |
| 2015/0276906 A1* | 10/2015 | Wiesinger | G01R 33/5608 324/309 |
| 2016/0104279 A1* | 4/2016 | Li | G06K 9/52 382/131 |
| 2016/0338600 A1* | 11/2016 | Edelman | A61B 5/0263 |
| 2018/0067184 A1* | 3/2018 | Weingartner | G01R 33/56545 |

FOREIGN PATENT DOCUMENTS

| | | |
|---|---|---|
| JP | 2014-100392 A | 6/2014 |
| KR | 10-2007-0034953 A | 3/2007 |
| KR | 10-2013-0112801 A | 10/2013 |

OTHER PUBLICATIONS

Communication dated Apr. 13, 2017 by the Korean Intellectual Property Office in counterpart Korean Patent Application No. 10-2015-0183009.
Communication dated May 19, 2017 by the European Patent Office in counterpart European Patent Application No. 16202449.1.
Communication dated Oct. 17, 2017, issued by the Korean Intellectual Property Office in counterpart Korean Patent Application No. 10-2015-0183009.
Communication dated Aug. 24, 2017, issued by the European Patent Office in counterpart European Patent Application No. 16202449.1.

* cited by examiner

MAGNETIC RESONANCE IMAGING APPARATUS AND METHOD OF CONTROLLING THE SAME

CROSS-REFERENCE TO RELATED APPLICATION(S)

This application claims the benefit of Korean Patent Application No. 10-2015-0183009, filed on Dec. 21, 2015 in the Korean Intellectual Property Office, the disclosure of which is incorporated herein by reference.

BACKGROUND

1. Field

Exemplary embodiments of the present disclosure relate to magnetic resonance imaging apparatuses configured acquire sectional images of an object and methods of controlling the same.

2. Description of the Related Art

In general, medical imaging apparatuses acquire information of a region in an object to be diagnosed and provide the information as an image. Among a variety of medical imaging apparatuses, magnetic resonance imaging apparatuses have relatively less strict imaging conditions, are safe without causing X-ray exposure, and provide excellent contrast in soft tissues and various diagnostic information images, thus occupying a prominent place in the field of diagnosis using medical images.

A magnetic resonance imaging apparatus may acquire a desired image by controlling coils provided in a gantry in accordance with various pulse sequences. Among pulse sequences used to acquire magnetic resonance images, saturation pulses are used to suppress generation of magnetic resonance signals at a given position by pre-applying RF signals to the given position.

SUMMARY

Therefore, it is an aspect of the present disclosure to provide a magnetic resonance imaging apparatus configured to acquire a sectional image of an object and implement a reduced Field of View (FOV) from which aliasing is removed by using a saturation pulse sequence that suppresses a magnetic resonance signal at a given position, and a method of controlling the same.

Additional aspects of the disclosure will be set forth in part in the description which follows and, in part, will be obvious from the description, or may be learned by practice of the disclosure.

In an exemplary embodiment, there is a magnetic resonance imaging apparatus including: a scanner including a first coil assembly configured to form a static magnetic field in a bore; a second coil assembly configured to apply a gradient to the formed static magnetic field; and a third coil assembly configured to apply an RF pulse to an object located in the bore; a sequence controller configured to control the scanner to apply an unsaturation pulse sequence to a first region of the object and a saturation pulse sequence to the first region of the object; and a data processor configured to acquire a first image by receiving a first magnetic resonance signal from the first region of the object to which the unsaturation pulse sequence is applied, acquire a second image by receiving a second magnetic resonance signal from the first region of the object to which the saturation pulse sequence is applied, and obtains a difference image based on a difference between the first image and the second image.

In yet another exemplary embodiment, there is a method of controlling a magnetic resonance imaging apparatus, the method including: acquiring a first image by applying an unsaturation pulse sequence to a first region of an object; acquiring a second image by applying a saturation pulse sequence to the first region of the object; and obtaining a difference image based on a difference between the first image and the second image.

In accordance with an aspect of an exemplary embodiment, a magnetic resonance imaging apparatus may include: a scanner including a static magnetic field coil assembly configured to form a static magnetic field in a bore, a gradient coil assembly configured to apply a gradient to the formed static magnetic field, and a radio frequency (RF) coil assembly configured to apply an RF pulse to an object located in the bore; a sequence controller configured to apply an unsaturation pulse sequence to a first region of the object and a saturation pulse sequence to the first region of the object by controlling the scanner; and a data processor configured to acquire a first image by receiving a magnetic resonance signal from the first region of the object to which the unsaturation pulse sequence is applied, acquire a second image by receiving a magnetic resonance signal from the first region of the object to which the saturation pulse sequence is applied, and generate a difference image between the first image and the second image.

The sequence controller may be configured to saturate at least one region in the first region of the object via application of the saturation pulse sequence.

The sequence controller may be configured to suppress generation of the magnetic resonance signal in the at least one region by pre-applying the RF pulse to the at least one region.

The first region may include a volume in the object, and the unsaturation pulse sequence and the saturation pulse sequence are slice non-selective sequences.

The sequence controller may be configured to saturate at least one slice region in the volume via application of the saturation pulse sequence.

The data processor may be configured to acquire a section image of the saturated slice region via subtraction of the second image from the first image.

The first region may correspond to a slice in the object, and the unsaturation pulse sequence and the saturation pulse sequence may be slice selective sequences.

The sequence controller may be configured to saturate at least one region of interest (ROI) in the slice via application of the saturation pulse sequence.

The data processor may be configured to extract the saturated ROI via subtraction of the second image from the first image.

The first region may correspond to a reduced Field of View (FOV).

The sequence controller may be configured to saturate the reduced FOV via application of the saturation pulse sequence.

The data processor may be configured to acquire an image of the reduced FOV from which aliasing is removed via subtraction of the second image from the first image.

In accordance with an aspect of another exemplary embodiment, a magnetic resonance imaging apparatus may include: a scanner including a static magnetic field coil assembly configured to form a static magnetic field in a bore, a gradient coil assembly configured to apply a gradient to the formed static magnetic field, and a radio frequency (RF) coil assembly configured to apply an RF pulse to an object located in the bore; a controller configured to apply a saturation pulse sequence to saturate a first region in a first volume of an object and a saturation pulse sequence to saturate a second region in the first volume of the object to the first volume by controlling the scanner; and a data processor configured to acquire a first image by receiving a magnetic resonance signal from the first volume of the object to which the saturation pulse sequence to saturate the first region is applied, acquire a second image by receiving a magnetic resonance signal from the first volume of the object to which the saturation pulse sequence to saturate the second region is applied, and generate a difference image between the first image and the second image.

The first region may correspond to a first slice in the first volume, and the second region corresponds to a second slice including the first slice and having a greater thickness than the first slice.

The data processor may be configured to acquire a sectional image of a slice corresponding to a difference between the first region and the second region via subtraction of the second image from the first image.

In accordance with an aspect of another exemplary embodiment, a method of controlling a magnetic resonance imaging apparatus may include: acquiring a first image by applying an unsaturation pulse sequence to a first region of an object; acquiring a second image by applying a saturation pulse sequence to the first region of the object; and generating a difference image between the first image and the second image.

The acquiring of the second image by applying the saturation pulse sequence to the first region of the object may include saturating at least one region in the first region of the object via application of the saturation pulse sequence.

The saturating of the at least one region in the first region of the object may include suppressing generation of a magnetic resonance signal in the at least one region by pre-applying a radio frequency (RF) pulse to the at least one region.

The first region may include a volume in the object, and the unsaturation pulse sequence and the saturation pulse sequence are slice non-selective sequences.

The acquiring of the second image by applying the saturation pulse sequence to the first region of the object may include saturating at least one slice region in the volume via application of the saturation pulse sequence.

The acquiring of the second image by applying the saturation pulse sequence to the first region of the object may include: pre-applying an RF pulse to the at least one slice region; and applying the RF pulse to the entire volume.

The generating of the difference image between the first image and the second image may include acquiring a sectional image of the saturated slice region via subtraction of the second image from the first image.

The first region may correspond to a slice in the object, and the unsaturation pulse sequence and the saturation pulse sequence may be slice selective sequences.

The acquiring of the second image by applying the saturation pulse sequence to the first region of the object may include saturating at least one region of interest (ROI) included in the slice via application of the saturation pulse sequence.

The acquiring of the second image by applying the saturation pulse sequence to the first region of the object may include: pre-applying an RF pulse to the at least one ROI; and applying the RF pulse to the entire slice.

The generating of the difference image between the first image and the second image may include acquiring a sectional image of the saturated ROI via subtraction of the second image from the first image.

The first region may correspond to a reduced Field of View (FOV).

The acquiring of the second image by applying the saturation pulse sequence to the first region of the object may include saturating the reduced FOV via application of the saturation pulse sequence.

The generating of the difference image between the first image and the second image may include acquiring an image of the reduced FOV from which aliasing is removed via subtraction of the second image from the first image.

In accordance with an aspect of another exemplary embodiment, a method of controlling a magnetic resonance imaging apparatus may include: acquiring a first image by applying a saturation pulse sequence to saturate a first region in a first volume of an object to the first volume; acquiring a second image by applying a saturation pulse sequence to saturate a second region in the first volume of the object to the first volume; and generating a difference image between the first image and the second image.

The first region may correspond to a first slice in the first volume, and the second region corresponds to a second slice including the first slice and having a greater thickness than the first slice.

The generating of the difference image between the first image and the second image may be performed by acquiring a sectional image of a slice corresponding to a difference between the first region and the second region via subtraction of the second image from the first image.

BRIEF DESCRIPTION OF THE DRAWINGS

These and/or other aspects of the disclosure will become apparent and more readily appreciated from the following description of the exemplary embodiments, taken in conjunction with the accompanying drawings of which.

DETAILED DESCRIPTION

Figure 1:
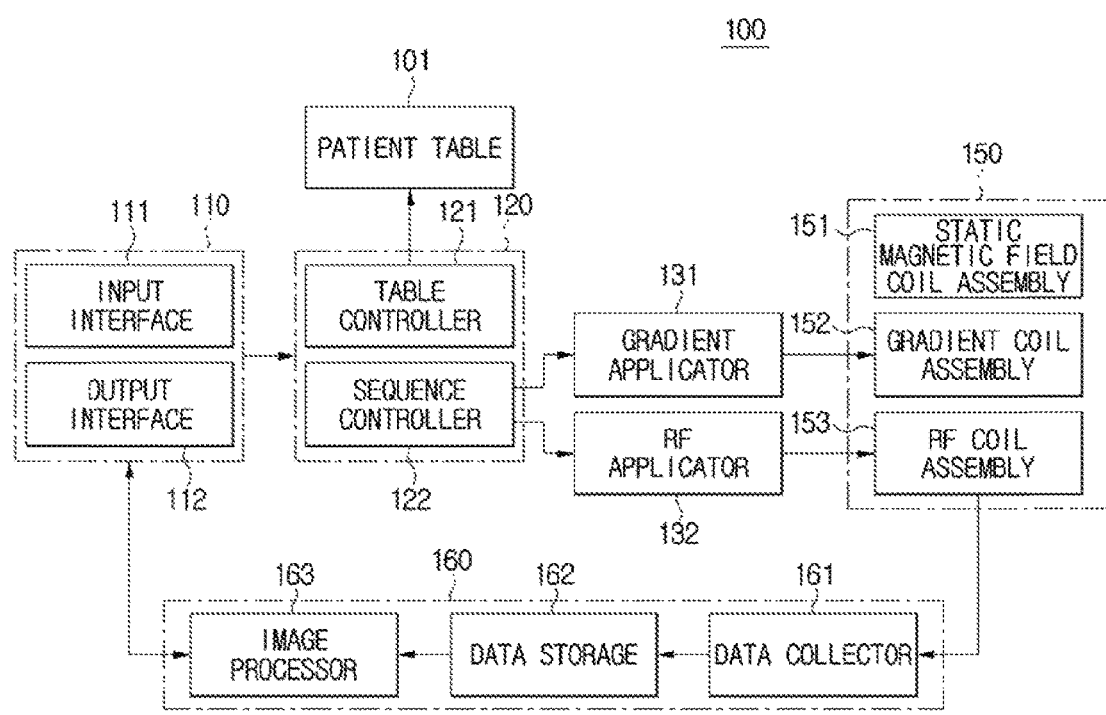
FIG. 1 is a control block diagram illustrating a magnetic resonance imaging apparatus according to an exemplary embodiment.

Reference will now be made in detail to the exemplary embodiments of the present disclosure, examples of which are illustrated in the accompanying drawings, wherein like reference numerals refer to like elements throughout.

Hereinafter a magnetic resonance imaging apparatus and a method of controlling the same according to an exemplary embodiment will be described in detail with reference to the drawings.

FIG. 1 is a control block diagram illustrating a magnetic resonance imaging apparatus according to an exemplary embodiment.

Referring to FIG. 1, a magnetic resonance imaging apparatus 100 according to an exemplary embodiment includes a scanner 150 configured to form a magnetic field and receive a magnetic resonance signal generated in an object, a controller 120 configured to control operation of the scanner 150, and a data processor 160 configured to receive the magnetic resonance signal and generate a magnetic resonance image.

The scanner 150 includes a static magnetic field coil assembly 151 configured to form a static magnetic field, a gradient coil assembly 152 configured to form a gradient field by applying a gradient to the static magnetic field, and an RF coil assembly 153 configured to excite atomic nucleic by applying an RF pulse to the object and receive an echo signal from the atomic nuclei. In another exemplary embodiment, the scanner 150 includes a first coil assembly configured to form a static magnetic field, a second coil assembly configured to form a gradient field by applying a gradient to the static magnetic field, and a third coil assembly configured to excite atomic nucleic by applying an RF pulse to the object and receive an echo signal from the atomic nuclei.

The magnetic resonance imaging apparatus 100 may include a patient table 101 configured to transport an object 50 into a bore 154 (refers to FIG. 2). The controller 120 may include a table controller 121 configured to control movement of the table 101 and a sequence controller 122 configured to control operation of the scanner 150 to perform a scan sequence.

The controller 120 may include a memory configured to non-temporarily or temporarily store programs which perform the exemplary operations which will be described later and data for executing the programs and a processor configured to execute the programs stored in the memory.

The table controller 121 and the sequence controller 122 may share the processor or the memory or may use separate processors or memories. Also, the controller 120 and some or all of elements of the data processor 160 may share the processor or the memory or may share a single computer.

The table controller 121 may move the table 101 such that a region of the object 50 to be imaged is located at an isocenter of a magnetic field formed in the bore 154. As the region is farther from the isocenter of the magnetic field formed in the bore 154, uniformity of the magnetic field decreases. Thus, magnetic resonance data may be obtained at a position closest to the isocenter to minimize distortion of an image. The isocenter refers to a center of the magnetic field formed in the bore 154.

The sequence controller 122 controls the gradient coil assembly 152 and the RF coil assembly 153 in accordance with a scan sequence appropriate for a region of the object to be imaged or a diagnosis. Operation of the sequence controller 122 will be described in detail later.

The magnetic resonance imaging apparatus 100 may further include a gradient applicator 131 configured to apply a gradient current to generate a gradient field, to the gradient coil assembly 152 and an RF applicator 132 configured to transmit an RF signal to the RF coil assembly 153. For example, the gradient applicator 131 may be implemented using a circuit including a gradient amplifier, and the RF applicator 132 may include a modulation circuit configured to modulate an RF signal into a pulse signal, and a pre-amplifier.

The sequence controller 122 may control the gradient coil assembly 152 and the RF coil assembly 153 via the gradient applicator 131 and the RF applicator 132 to control the gradient field formed in the bore 154 and RF pulses applied to the object 50.

Thus, the sequence controller 122 may be connected to the gradient applicator 131 to control timing, shape, and the like of a gradient waveform and connected to the RF applicator 132 to control timing, strength, shape, and the like of the RF pulse.

The RF coil assembly 153 is connected to the data processor 160, and the data processor 160 includes a data collector 161 configured to receive the magnetic resonance signal acquired by the RF coil assembly 153, a data storage 162 configured to store k-space data, and an image processor 163 configured to restore a magnetic resonance image using the k-space data.

The data collector 161 may include a receiver configured to receive the magnetic resonance signal acquired by the RF coil assembly 153, a pre-amplifier configured to amplify the magnetic resonance signal, a phase detector configured to detect a phase upon receiving the magnetic resonance signal from the pre-amplifier, and an A/D converter configured to convert an analog signal acquired through phase detection into a digital signal. The data collector 161 transmits the magnetic resonance signal converted into the digital signal to the data storage 162.

A mathematical space to store magnetic resonance data is formed in the data storage 162, and this mathematical space is referred to as k-space. For example, the k-space may be a 2D Fourier space.

When construction of k-space data is completed as magnetic resonance data is stored in the data storage 162, the image processor 163 generates a magnetic resonance image using various image restoration methods. For example, an image may be restored via, i.e., based on, inverse Fourier transformation of k-space data.

In addition, the magnetic resonance imaging apparatus 100 may include a user interface 110 including an input interface 111 and an output interface 112. The magnetic resonance imaging apparatus 100 may receive control commands related to the overall operation of the magnetic resonance imaging apparatus 100 from a user via the input interface 111. Particularly, upon receiving commands regarding a method of acquiring a magnetic resonance image or a pulse sequence from the user, the sequence controller 122 may control the RF coil assembly 153 to control a pulse sequence in accordance with the received command.

The output interface 112 may display various information to control the magnetic resonance imaging apparatus 100 and a magnetic resonance image generated by the image processor 163.

The input interface 111 may include at least one of various input devices such as keyboard, mouse, trackball, keypad, and touch pad, and the output interface 112 may include at least one of various display devices such as liquid crystal display (LCD), light emission display (LED), organic light emission display (OLED), plasma display panel (PDP), and cathode ray tube (CRT).

In addition, the input interface 111 and the output interface 112 may be implemented using a touch screen in which a touch panel is disposed over the entire surface of a display.

Figure 2A:
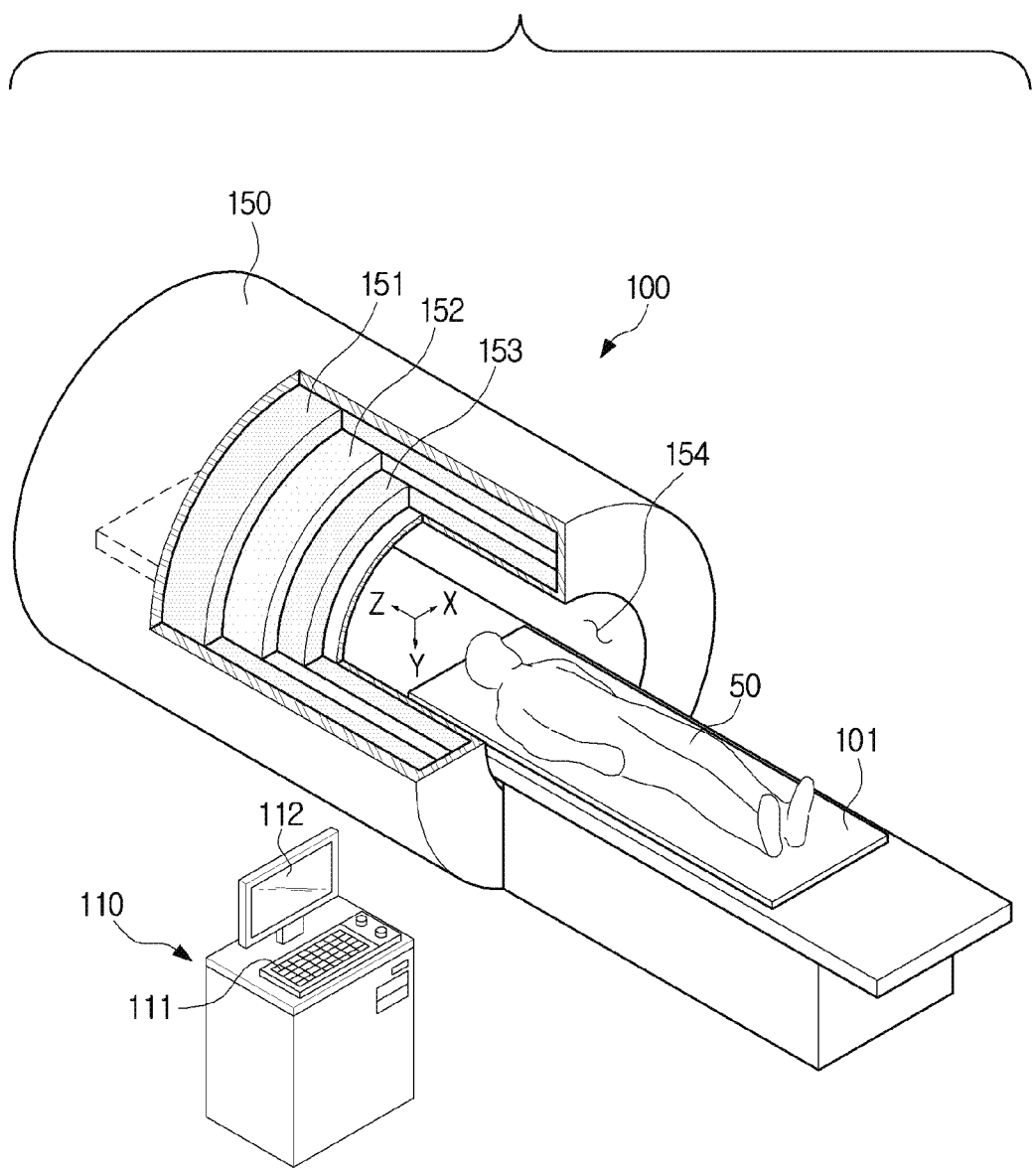
FIGS. 2A and 2B are views schematically illustrating magnetic resonance imaging apparatuses.
Figure 2B:
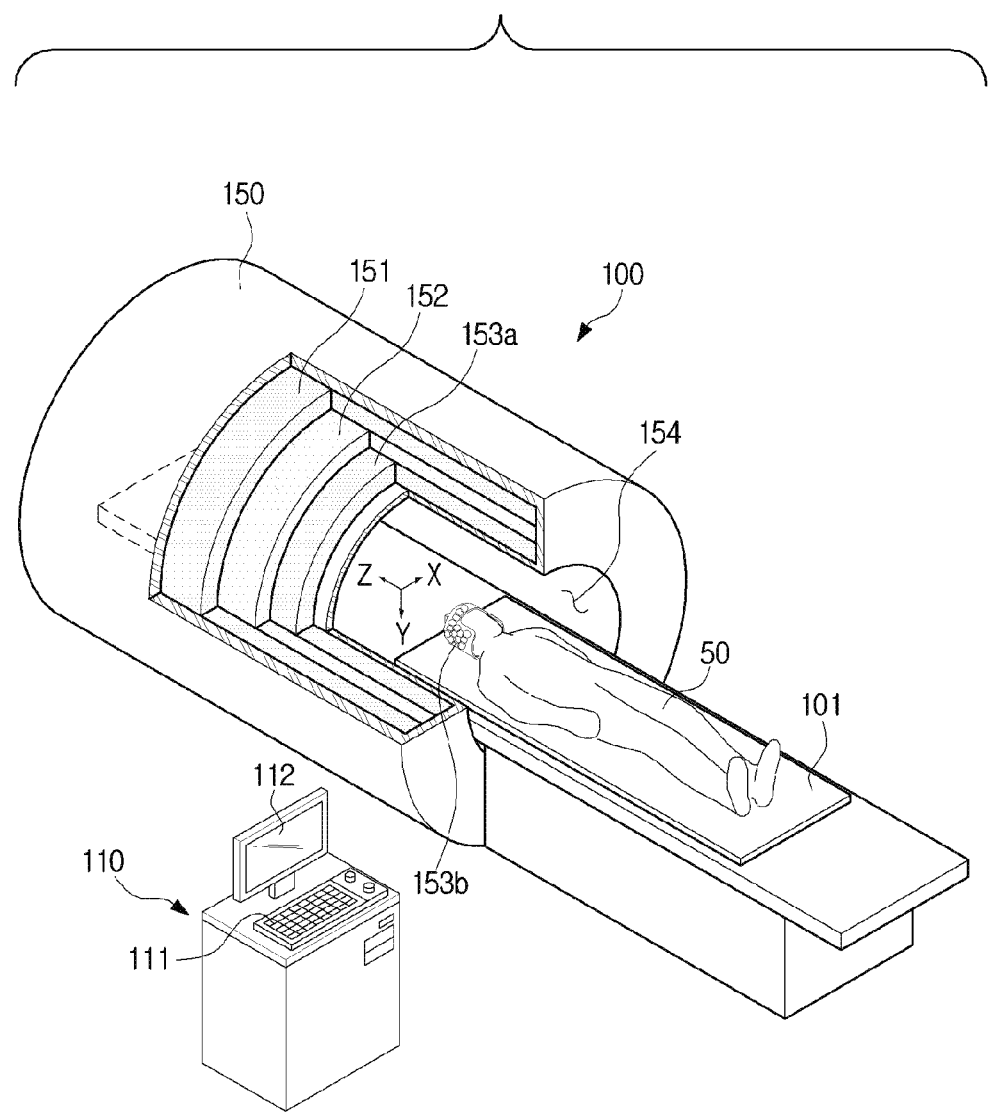
Figure 3:
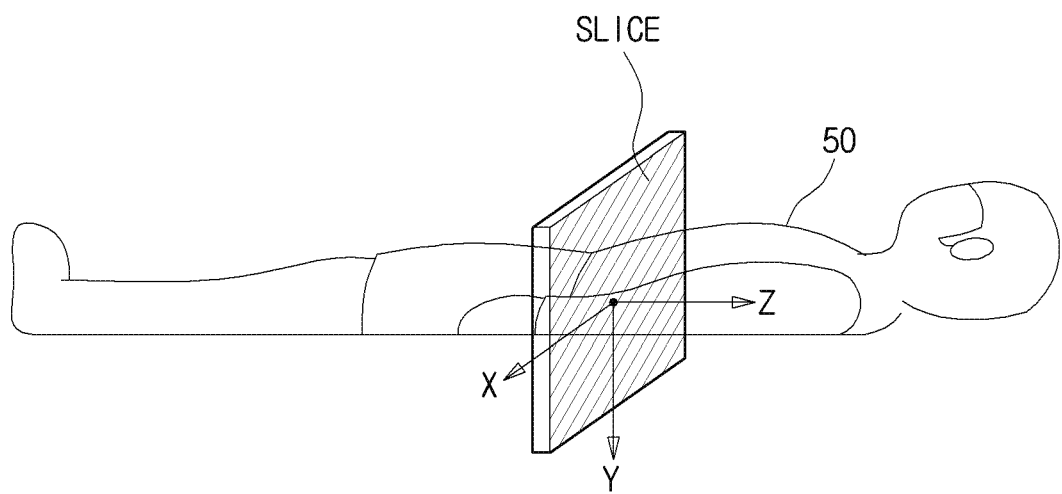
FIG. 3 is a view illustrating division of a space in which an object is located, along X, Y, and Z axes.
Figure 4:
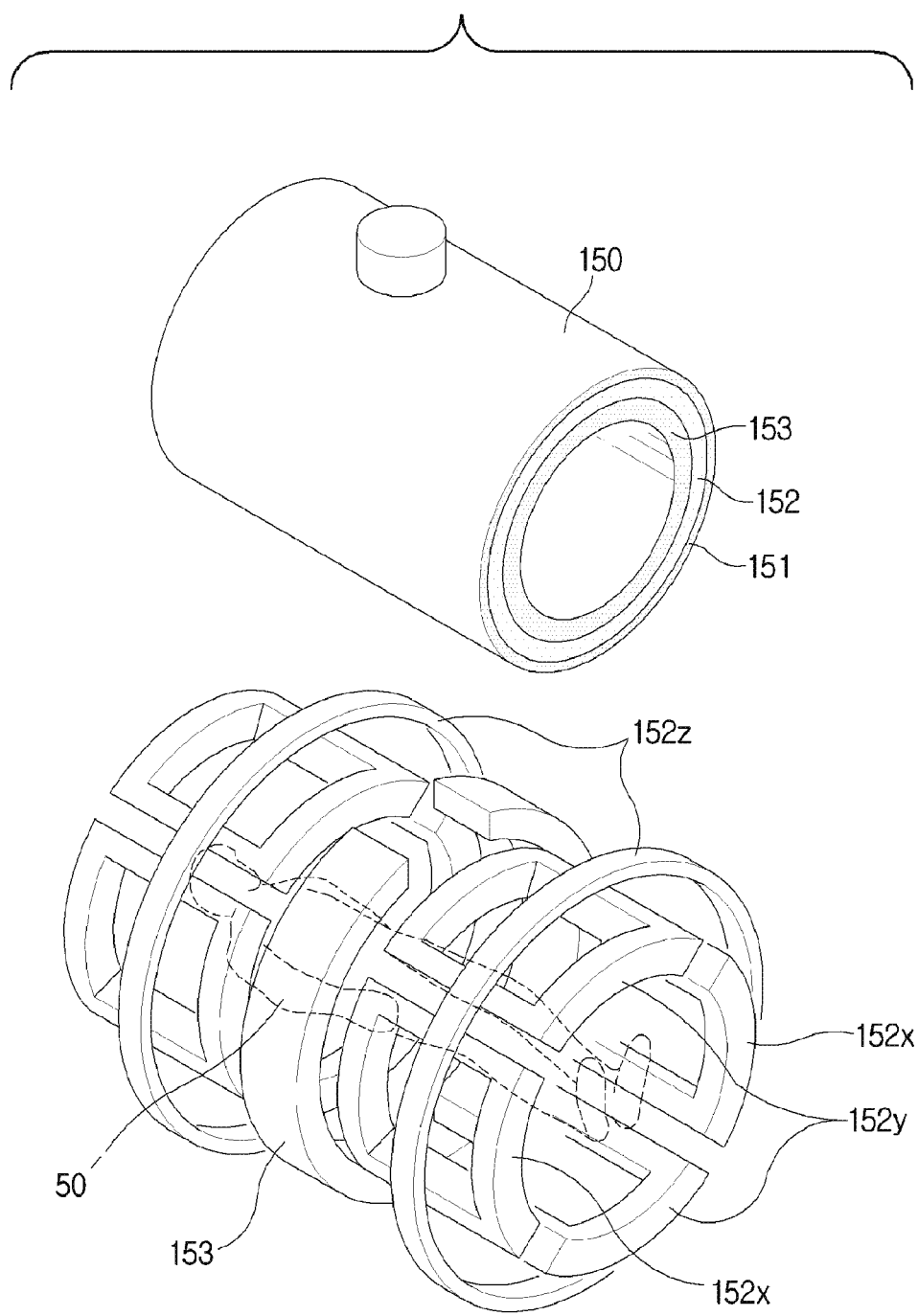
FIG. 4 is a view illustrating structures of a scanner and a gradient coil.

FIGS. 2A and 2B are views schematically illustrating appearances of magnetic resonance imaging apparatuses. FIG. 3 is a view illustrating division of a space in which an object is located, along X, Y, and Z axes. FIG. 4 is a view illustrating structures of a scanner and a gradient coil.

Hereinafter, operation of the magnetic resonance imaging apparatus 100 will be described in detail with reference to FIG. 1 and the following drawings.

Referring to FIGS. 2A and 2B, the scanner 150 has a cylindrical shape with a vacant inner space and may be referred to as a gantry. The scanner 150 may be formed in a shape in which a plurality of coils is wound around the bore 154, i.e., the vacant inner space.

The table 101 transports the object 50 lying thereon into the bore 154. When the user inputs a comment about a position of the table 101 by manipulating the input interface 111, the table controller 121 may control the patient table 101 to transport the table 101 to a position desired by the user or may automatically transport the table 101 without receiving an input from the user.

The user interface 110 may be included in a workstation or host device separated from the scanner 150 as illustrated in FIGS. 2A and 2B. Also, some or all of the elements of the controller 120 and the data processor 160 may be included in the workstation or host device.

The scanner 150 includes the static magnetic field coil assembly 151, the gradient coil assembly 152, and the RF coil assembly 153.

As illustrated in FIG. 2A, both transmit coils and receive coils of the RF coil assembly 153 may be installed in the scanner 150. Alternatively, transmit coils 153a may be installed in the scanner 150 and receive coils 153b may be directly installed at an imaged region of the object 50 as illustrated in FIG. 2B. For example, if the imaged region is a head of the object 50, the receive coils 153b may be formed in a helmet shape worn by the head.

Examples of the receive coils 153b may include a surface coil, a volume coil, and an array coil.

The static magnetic field coil assembly 151 includes coils to generate a static magnetic field in the bore 154 which are referred to as a main magnet. The main magnet may also be implemented using a superconductive magnet. In this case, the static magnetic field coil assembly 151 includes superconductive coils.

The static magnetic field coil assembly 151 may have a shape in which coils are wound around the bore 154, and a static magnetic field having a uniform magnitude is formed by the static magnetic field coil assembly 151. A direction of the static magnetic field is generally parallel to a longitudinal axis of the scanner 150.

When the static magnetic field is formed in the bore 154, nuclei of atoms constituting the object 50, particularly, nuclei of hydrogen atoms, are arranged in the direction of the static magnetic field and perform precession about the direction of the static magnetic field. Precession speed of the atomic nuclei may be expressed by precession frequency. The precession frequency is referred to as Larmor frequency, which is represented by Equation 1 below.

$$\omega = \gamma B_0 \qquad \text{Equation 1}$$

In Equation 1, $\omega$ is Larmor frequency, $\gamma$ is proportional constant, and $B_0$ is intensity of an external magnetic field. The proportional constant varies according to the type of atomic nuclei. A unit of the intensity of the external magnetic field is tesla (T) or gauss (G), and a unit of the precession frequency is Hz.

For example, a hydrogen proton has a precession frequency of 42.58 MHz in an external magnetic field of 1 T. Since hydrogen occupies the greatest ratio among atoms constituting the human body, the magnetic resonance imaging apparatus 100 obtains magnetic resonance signals using precession of hydrogen protons.

As illustrated in FIG. 3, on the assumption that a longitudinal axis of the object 50 is parallel to a longitudinal axis of the scanner 150, an axis running parallel to the longitudinal direction from the head to the feet of the object 50, i.e., an axis parallel to the direction of the static magnetic field, may be defined as the Z-axis. An axis parallel to the lateral direction of the object 50 may be defined as the X-axis, and a radial axis parallel to a vertical direction of the space may be defined as the Y-axis.

If the longitudinal axis of the object 50 is parallel to the direction of the static magnetic field, a lateral sectional image of the object 50 may be obtained. A slice with a uniform thickness may be selected to acquire the sectional image.

In order to obtain 3D spatial information by the magnetic resonance signal, gradient fields for all of the X, Y, and Z axes are required. Thus, the gradient coil assembly 152 may include three pairs of gradient coils respectively corresponding to the X, Y, and Z axes.

As illustrated in FIG. 4, Z-axis gradient coils 152z are formed of a pair of ring-shaped coils, and Y-axis gradient coils 152y are located above and below the object 50. X-axis gradient coils 152x are located at both sides of the object 50.

The Z-axis gradient coils 152z are used for slice selection, the Y-axis gradient coils 152y are used for phase encoding, and the X-axis gradient coils 152x are used for frequency encoding, which will be described later.

Figure 5:
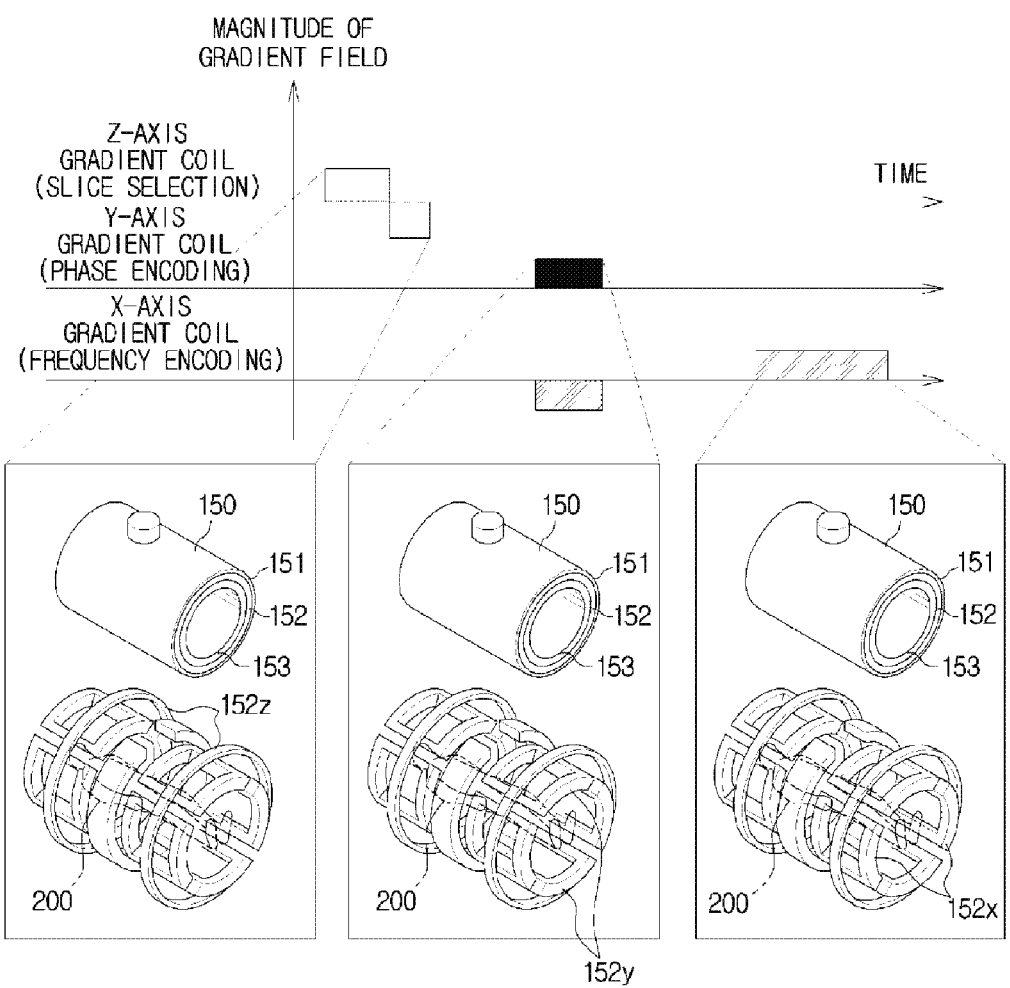
FIG. 5 is a view illustrating a pulse sequence related to operation of a gradient coil.

FIG. 5 is a view illustrating a pulse sequence related to operation of a gradient coil.

When direct currents having opposite polarities flow in the two Z-axis gradient coils 152z in opposite direction, the magnetic field changes in the Z-axial direction, and thus a gradient field is formed.

When the gradient field is formed by the current flows in the Z-axis gradient coils 152z for a given time period, a resonance frequency is changed to a higher frequency or a lower frequency according to a magnitude of the gradient field. Then, when the RF coil assembly 153 generates an RF pulse corresponding to a designated position, protons of only a slice corresponding to the designated position resonate. Thus, the Z-axis gradient coil 152z is used for slice selection. As a gradient of the gradient field formed in the Z-axial direction increases, a slice having a smaller thickness may be selected.

When the slice is selected by the gradient field formed by the Z-axis gradient coils 152z, all spins constituting the slice have the same frequency and the same phase, and thus the respective spins are indistinguishable from one another.

At this time, when a gradient field is formed in the Y-axial direction by the Y-axis gradient coils 152y, the gradient field causes a phase shift such that rows constituting the slice have different phases.

That is, when the Y-axis gradient field is formed, a phase shift occurs in the spins of a row to which a larger gradient field is applied to a higher frequency, and a phase shift occurs in the spins of a row to which a smaller gradient field is applied to a lower frequency. When the Y-axis gradient field is removed, phase shifts occur in the respective rows of the selected slice and thus the rows have different phases. Thus, these rows may be distinguished from one another. As described above, the gradient field formed by the Y-axis gradient coils 152y is used in phase encoding.

The slice is selected by the gradient field formed by the Z-axis gradient coils 152z, and the rows constituting the selected slice are distinguished from one another by different phases thereof through the gradient field formed by the Y-axis gradient coils 152y. However, the respective spins constituting each row have the same frequency and the same phase, and thereby indistinguishable from one another.

In this case, when a gradient field is formed in the X-axial direction by the X-axis gradient coils 152x, the X-axis gradient field makes the spins constituting each row have different frequencies so that the respective spins are distinguishable from one another. As described above, the gradient field formed by the X-axis gradient coils 152x is used in frequency encoding.

As described above, the gradient fields formed by the Z-axis, the Y-axis, and the X-axis gradient coils execute spatial encoding of the respective spins, through slice selection, phase encoding, and frequency encoding.

The gradient coil assembly 152 is connected to the gradient applicator 131, and the gradient applicator 131 generates a gradient field by applying a gradient waveform, i.e., a current pulse, to the gradient coil assembly 152 according to a control signal received from the sequence controller 122. Thus, the gradient applicator 131 may also be referred to as a gradient power source and include three drive circuits corresponding to the three pairs of gradient coils 152x, 152y, and 152z constituting the gradient coil assembly 152.

As described above, the atomic nuclei arranged by the external magnetic field execute precession at Larmor frequency, and a magnetization vector sum of several atomic nuclei may be represented as net magnetization M.

A Z-axis component of the net magnetization m cannot be measured, and only $M_{xy}$ may be detected. Thus, in order to acquire a magnetic resonance signal, the net magnetization should be present on the X-Y plane through excitation of the atomic nuclei. In order to excite the atomic nuclei, an RF pulse tuned to the Larmor frequency of the atomic nuclei should be applied.

Examples of the pulse sequence used to obtain the magnetic resonance signal from atomic nuclei may include a gradient echo pulse sequence and a spin echo pulse sequence. Hereinafter, the spin echo pulse sequence will be exemplarily described in detail.

Figure 6:
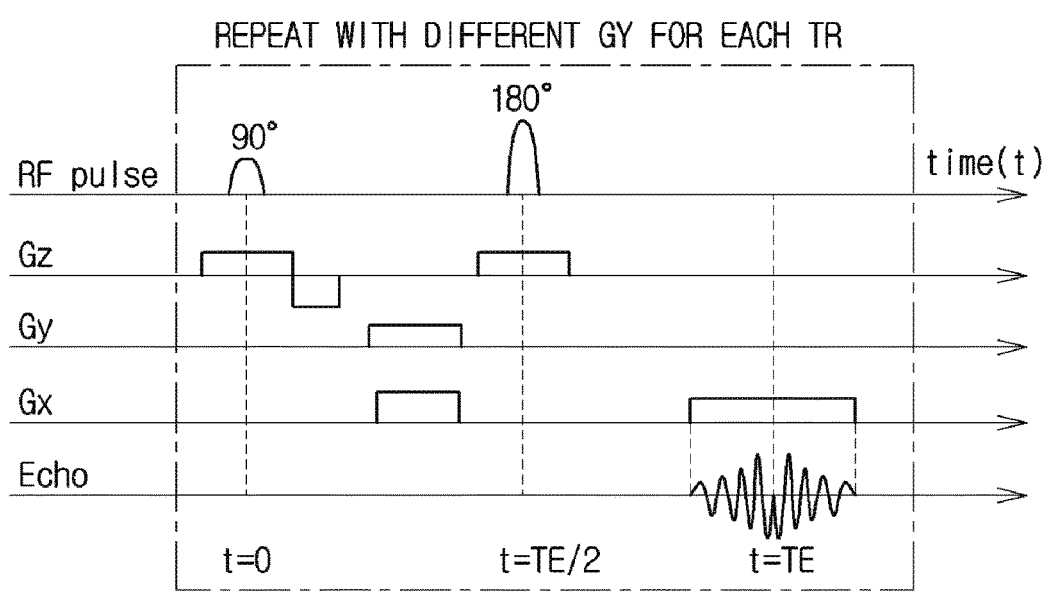
FIG. 6 is a pulse sequence diagram obtained by using a spin echo pulse sequence.

FIG. 6 is a pulse sequence diagram obtained by using a spin echo pulse sequence.

Referring to FIG. 6, the RF coil assembly 153 applies an RF pulse for excitation of atomic nuclei (hereinafter, referred to as exciting RF pulse) to the object first. By application of the exciting RF pulse, spins are dephased due to non-uniformity of the magnetic field and interaction between spins. In this case, free induction decay (FID) signals which rapidly decrease are generated.

Thus, in order to acquire a stable signal, a refocusing RF pulse, which refocuses the dephased spins, is applied thereto. Then, strong transverse magnetization occurs in the atomic nuclei occurs, and a stable echo signal after the FID signals disappear, i.e., a magnetic resonance signal, is acquired therefrom. This is referred to as a spin echo pulse sequence, and time taken to generate the magnetic resonance signal after application of the exciting RF pulse is referred to as echo time (TE).

If a time interval between application of the exciting RF pulse and application of the refocusing RF pulse is defined as Δt, the magnetic resonance signal is generated at the time interval Δt after application of the refocusing RF pulse. Thus, relationships represented by equation TE=2 Δt are satisfied.

A flip degree of protons may be represented as an angle to which the protons move from the axis where the protons are located before flip, and be represented as a 90° RF pulse, a 180° RF pulse, or the like according to the flip degree of the protons. In the spin echo pulse sequence, the 90° RF pulse is generally used as the exciting RF pulse, and the 180° RF pulse is generally used as the refocusing RF pulse.

Referring to FIG. 6, when a Z-axis gradient field is applied simultaneously with the 90° RF pulse, only protons of a given position corresponding to a specific slice resonate. If a Y-axis gradient field is applied and application thereof is stopped to add locational information to the signal, phase difference occurs among the protons.

When the 180° RF pulse is applied to acquire a spin echo signal, spins dephased by non-uniformity of the magnetic field and chemical shifting are remagnetized.

Application of an X-axis gradient field (Gx) after application of the 180° RF pulse may maximize the echo signal due to rephased spins by the 180° RF pulse.

The generated echo signal includes locational information on the X-axis and the Y-axis. Thus, signals acquired by the Y-axis gradient field and the X-axis gradient field fill the k-space, which is a 2D space defined by a kx-axis and a ky-axis.

Meanwhile, a plurality of echo signals may be obtained while changing magnitude of the Y-axis gradient field in order to acquire one sectional image. A time interval between application of one 90° RF pulse for an echo signal and application of another 90° RF pulse for the next echo signal is referred to as repetition time (TR).

Figure 7:
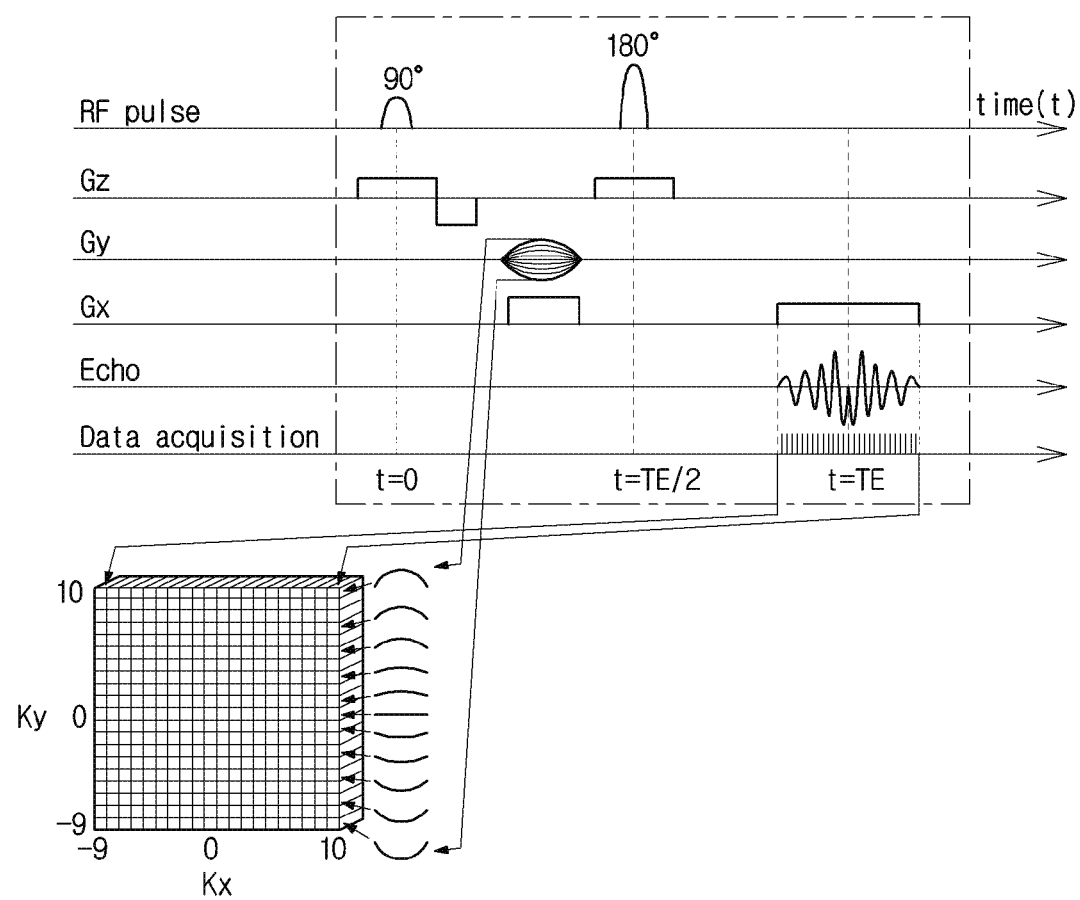
FIG. 7 is a diagram illustrating relationships between echo signals obtained plural times by changing magnitude of the Z-axis gradient field and a k-space.

FIG. 7 is a diagram illustrating relationships between echo signals obtained plural times by changing magnitude of the Z-axis gradient field and a k-space.

As described above, the k-space is formed in the data storage 161, the k-space data constructed by filling data in the k-space is stored in the data collector 161. The k-space, as a mathematical space to perform Fourier transformation, may be defined as the kx-axis representing frequency and ky-axis representing phase.

For example, if echo signals are obtained from 20 different Y-axis gradient fields, the ky-axis includes 20 horizontal lines, i.e., ky lines, and each of the echo signals respectively acquired by the Y-axis gradient fields fills one ky line as illustrated in FIG. 7. Thus, when all echo signals are obtained by the 20 different Y-axis gradient fields, 20 ky lines are filled with the echo signals, thereby completing construction of one piece of k-space data. One magnetic resonance image may be obtained by restoring one piece of k-space data.

Meanwhile, among magnetic resonance imaging techniques, a saturation pulse method is used to suppress generation of a magnetic resonance signal at a given position. According to the saturation pulse method, an RF energy is pre-applied to the given position to suppress generation of a magnetic resonance signal at the given position.

Particularly, saturation refers to disappearing or weakening of longitudinal magnetization of atomic nuclei. Atomic nuclei to which RF pulses are repeatedly applied may not be excited but saturated by a next RF pulse. Thus, by applying an RF pulse to the given position in advance, the atomic nuclei of the given position may not be excited but saturated when an RF pulse is applied to the entire region. Thus, information about an anatomical structure of a saturated region is not shown in the magnetic resonance image.

The saturation pulse method may be applied to various pulse sequences such as main spin echo sequence and gradient echo sequence. Thus, the saturation pulse method may be performed by pre-applying an RF pulse to the given position before starting a pulse sequence used to acquire a magnetic resonance image. In the following exemplary embodiments, an entire sequence including the pre-applied RF pulse and the RF pulse applied later to the entire region including the given position (the entire region may include only the given position according to an exemplary embodiment) is referred to as a saturation pulse sequence, and a sequence, which does not include pre-application of the RF pulse, i.e., a general pulse sequence, is referred to as a unsaturation pulse sequence to be distinguished from the saturation pulse sequence for descriptive convenience.

The magnetic resonance imaging apparatus 100 according to an exemplary embodiment may acquire a desired image by combining an image acquired based on an application of the unsaturation pulse sequence and an image acquired based on an application of the saturation pulse sequence. For example, a sectional image may be obtained from a volume image, a very thin sectional image may be obtained, and an image with a reduced FOV from which aliasing is removed may be obtained. Hereinafter, exemplary embodiments thereof will be described in detail.

Figure 8:
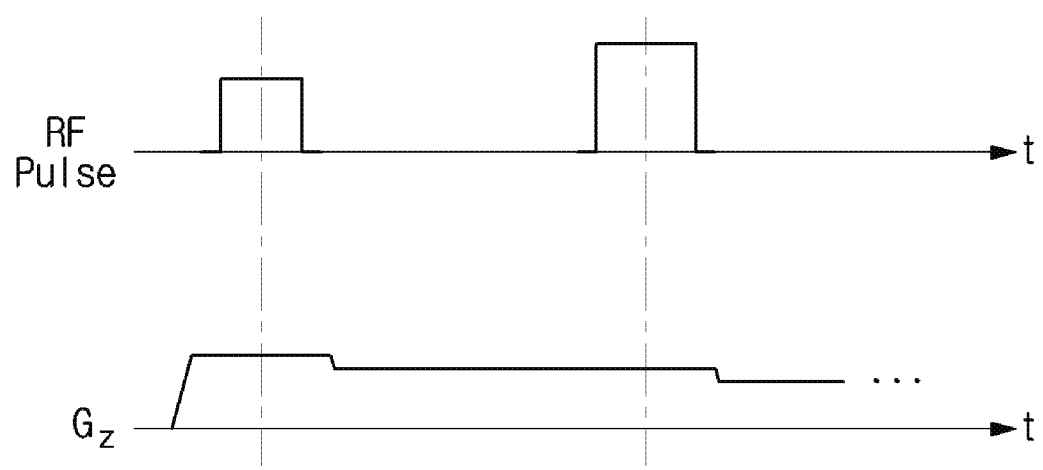
FIG. 8 is a view schematically illustrating a slice non-selective pulse sequence.
Figure 9:
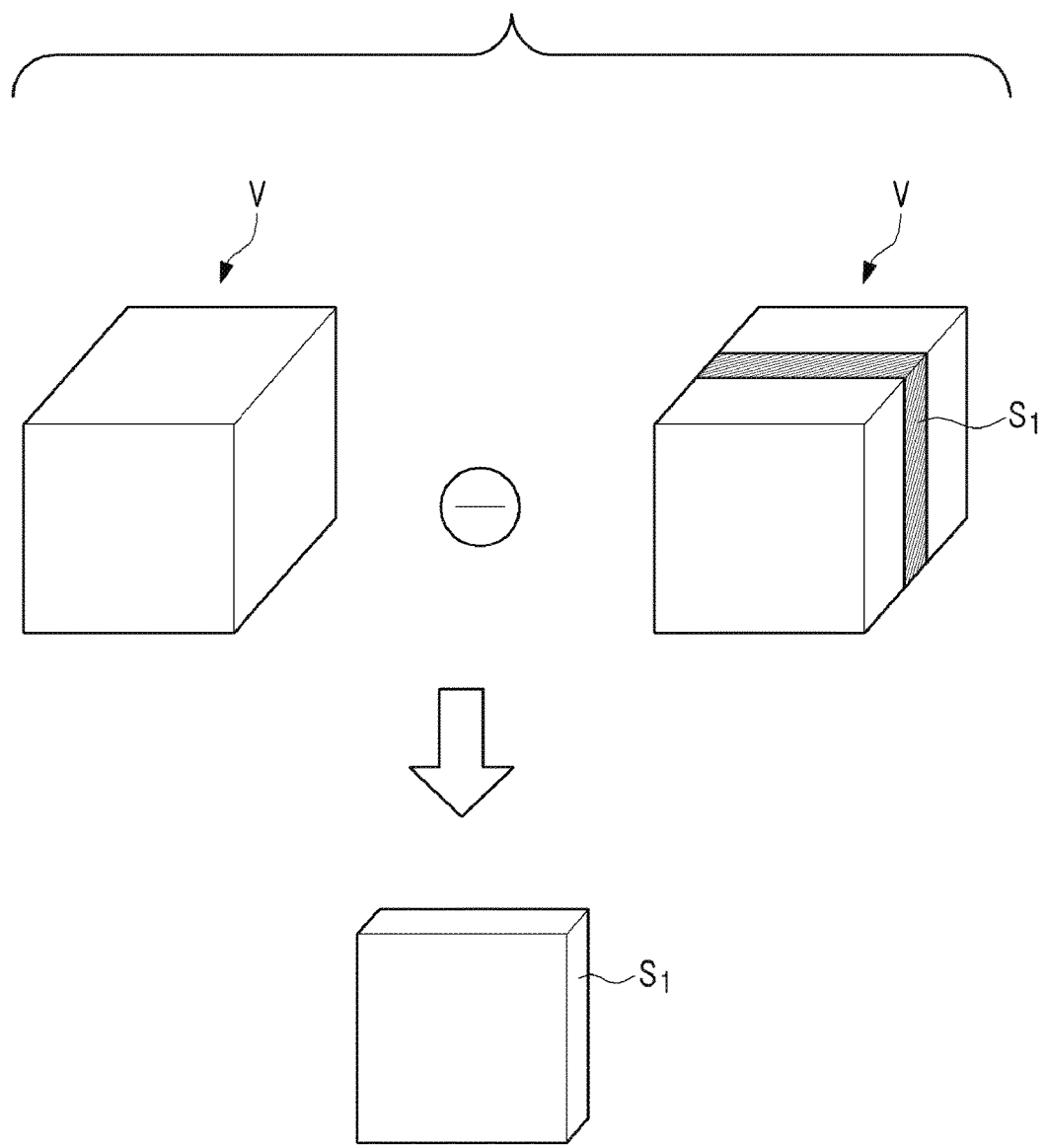
FIG. 9 is a view illustrating a process of obtaining a section image using a slice non-selective pulse sequence by a magnetic resonance imaging apparatus according to an exemplary embodiment.

FIG. 8 is a view schematically illustrating a slice non-selective pulse sequence. FIG. 9 is a view illustrating a process of obtaining a section image using a slice non-selective pulse sequence by a magnetic resonance imaging apparatus according to an exemplary embodiment.

The pulse sequence described above is used to acquire sectional images of the object using slice selective excitation by forming the Z-axis gradient field. However, pulse sequences applied to magnetic resonance imaging may also include a pulse sequence of acquiring a magnetic resonance image of a volume by using slice non-selective excitation as well as a pulse sequence of acquiring that by using slice selective excitation.

As illustrated in FIG. 8, an image of a predetermined volume may be acquired instead of a sectional image by gradually changing the Z-axis gradient field during application of the RF pulses. This type of pulse sequence may be referred to as silent sequence since noise generated by rapid changes in the gradient field is reduced thereby.

The magnetic resonance imaging apparatus 100 may acquire an unsaturated image by applying an unsaturation pulse sequence to a given region of the object and a saturated image by applying a saturation pulse sequence to the same region. In this regard, the saturated image is an image of a region including a saturated region. The saturated image may include only the saturated region or may also include an unsaturated region depending on a range of a region to which the RF pulse is pre-applied. The order of acquiring the unsaturated image and the saturated image is not limited.

Particularly, as illustrated in FIG. 9, an unsaturated image of a predetermined volume V may be acquired by using a slice non-selective pulse sequence, and then a saturated image in which the magnetic resonance signal of a first slice $S_1$ of the given position is suppressed may be acquired by using the slice non-selective pulse sequence and the saturation pulse method. In this regard, the position of the first slice $S_1$ may be selected by a user or automatically selected by the magnetic resonance imaging apparatus 100.

The silent sequence may be used as an example of the slice non-selective pulse sequence. However, the silent sequence is only an example applicable to the magnetic resonance imaging apparatus 100, and any other slice non-selective pulse sequences may also be used.

A saturated image may be acquired by pre-applying an RF pulse to the first slice $S_1$ and applying an RF pulse to the entire volume V including the first slice $S_1$. Since generation of the magnetic resonance signal is suppressed in the first slice $S_1$, and magnetic resonance signals are generated in the other regions, the saturated image includes data about only the other regions except for the first slice $S_1$.

The sequence controller 122 may control the gradient applicator 131 and the RF applicator 132 to apply the unsaturation pulse sequence and the saturation pulse sequence to the predetermined volume V. The data collector 161 and the data storage 162 may receive and store magnetic resonance signals generated from the predetermined volume V.

If the unsaturated image is referred to as a first image and the saturated image is referred to as a second image for descriptive convenience in this embodiment, the image processor 163 acquires the first image and the second image based on the magnetic resonance signals and generates a difference image between the first image and the second image. For example, the image processor 163 may generate, i.e., determine or obtains, the difference image based on a subtraction of the second image from the first image. In an exemplary embodiment, the difference image is obtained based on a difference between the first and the second images.

As illustrated in FIG. 9, the difference image between the first image and the second image may be a sectional image of the first slice $S_1$ saturated based on an application of the saturation pulse sequence. Thus, according to an exemplary embodiment, a sectional image may be acquired based on an application of the slice non-selective pulse sequence by acquiring a plurality of volume images based on an application of the slice non-selective pulse sequence such that at least one volume image is acquired as a saturated image in which a target region for the sectional image corresponding to the first slice $S_1$ is saturated, and the other volume images are acquired as unsaturated images in which the magnetic resonance signals are generated in all regions including the region corresponding to the first slice $S_1$.

In addition, the saturated first slice $S_1$ may be thinner than a slice selected by a general slice selective pulse sequence. As a result, an image of a slice having a thickness, which is not obtainable by the general slice selective pulse sequence, may be acquired.

In the following exemplary embodiments, a saturation pulse sequence including a slice selective pulse sequence is referred to as a slice selective saturation pulse sequence, and an unsaturation pulse sequence including a slice selective pulse sequence is referred to as a slice selective unsaturation pulse sequence for descriptive convenience. Also, a saturation pulse sequence including a slice non-selective pulse sequence is referred to as a slice non-selective saturation pulse sequence, and an unsaturation pulse sequence including a slice non-selective pulse sequence is referred to as a slice non-selective unsaturation pulse sequence.

Figure 10:
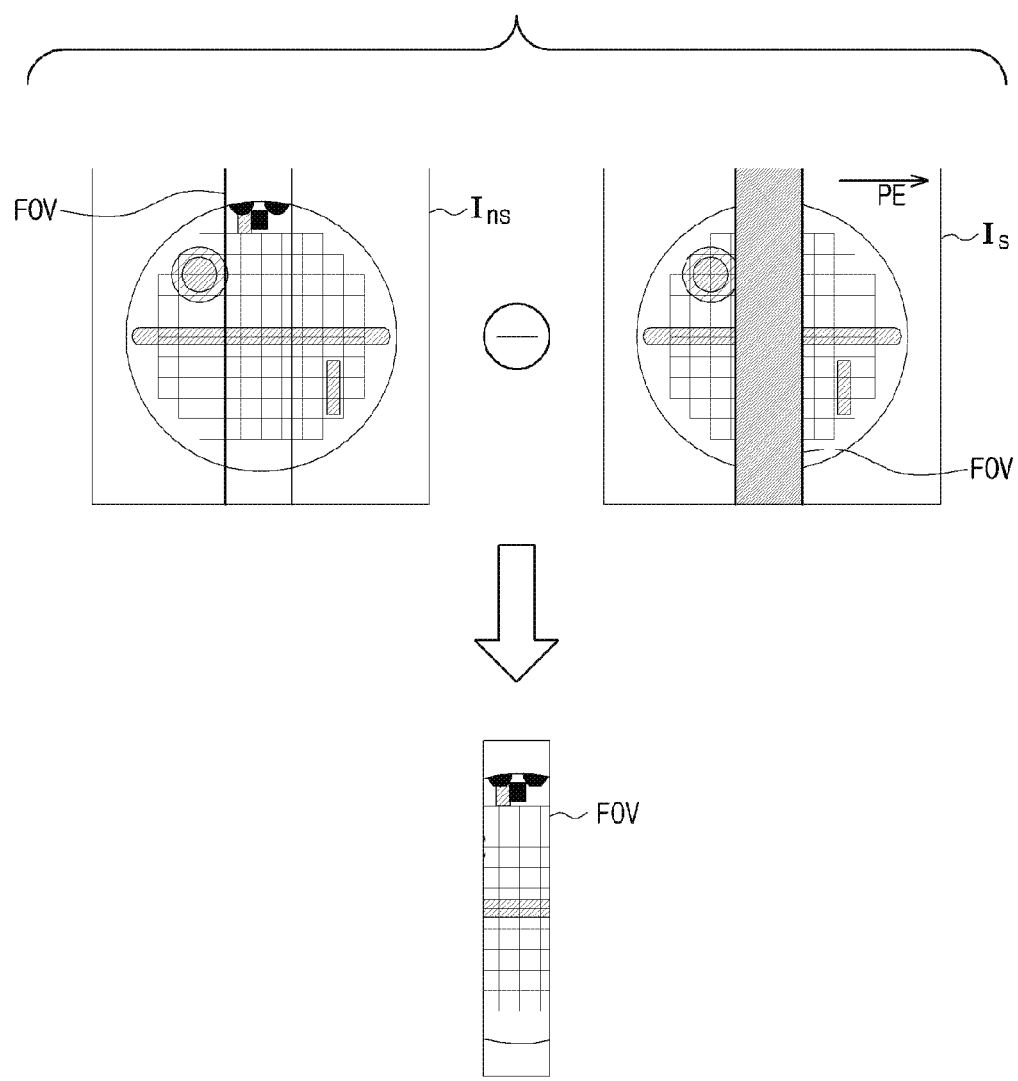
FIGS. 10 and 11 are views illustrating a process of extracting a region of interest (ROI) from a 2D sectional image.
Figure 11:
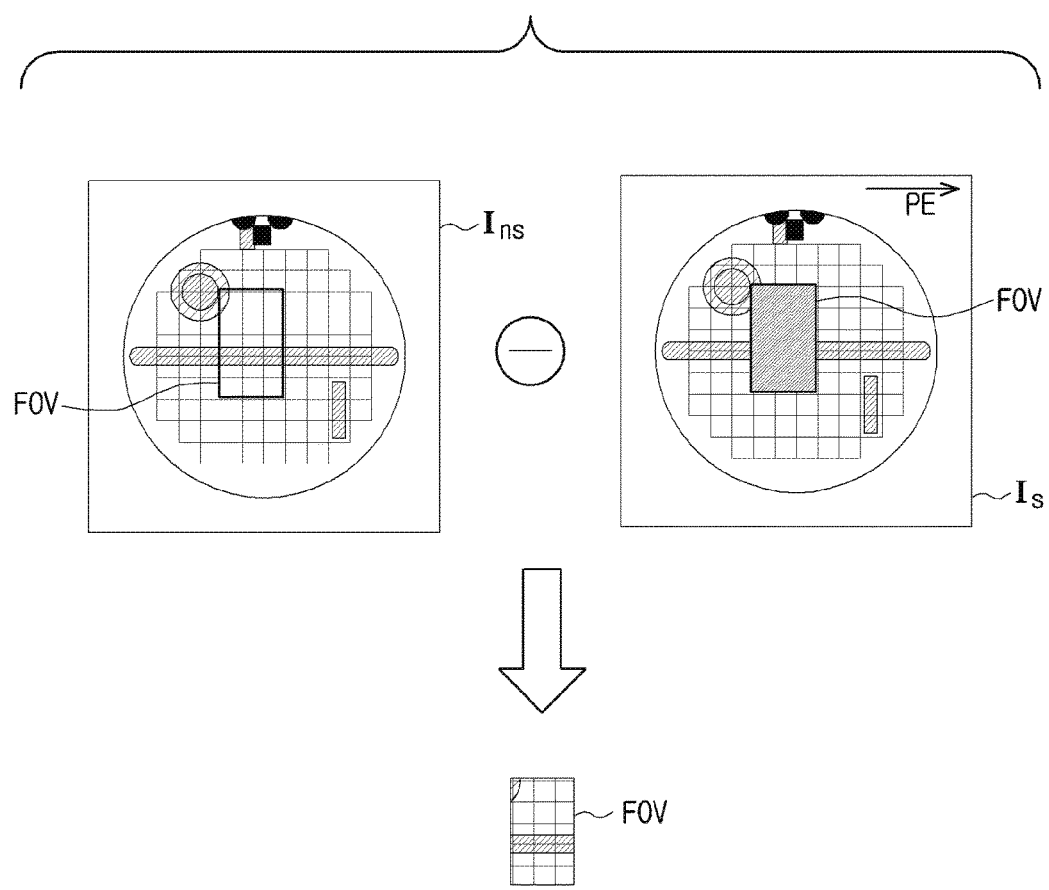

FIGS. 10 and 11 are views illustrating a process of extracting a region of interest (ROI) from a 2D sectional image.

Images illustrated in FIGS. 10 and 11 are acquired using phantom including structures having various shapes for locational recognition in the images.

Referring to FIGS. 10 and 11, the sequence controller 122 control to acquire an unsaturated sectional image $I_{ns}$ based on an application of the slice selective unsaturation pulse sequence and acquire a saturated sectional image $I_s$ based on an application of the slice selective saturation pulse sequence. In this regard, a saturated region may be a region of interest (ROI) of the object.

Various methods may be used to saturate only the ROI in a slice. For example, the saturated image $I_s$ in which the ROI is saturated may be acquired by pre-applying an RF pulse used in reduced FOV imaging such as 2D spatially selective RF excitation to only the ROI.

2D spatially selective RF excitation is a method of restricting excitation of spins within a selected range and may perform excitation by selecting restricted regions in not only a slice selection direction but also a phase encoding (PE) direction.

The image processor 163 may extract only the ROI by using the unsaturated image $I_{ns}$ and the saturated image $I_s$ of the same slice. For example, a difference image between the unsaturated image $I_{ns}$ and the saturated image $I_s$ may be generated based on a subtraction of the saturated image $I_s$ from the unsaturated image $I_{ns}$.

In this regard, the difference image is an image including only the extracted ROI. When a restricted region is saturated along the phase encoding direction in the slice, an ROI image having a restricted region along the phase encoding direction is generated as illustrated in FIG. 10. When a restricted region is saturated along the phase encoding direction and a frequency encoding direction, an ROI image having a restricted region in both directions is generated as illustrated in FIG. 11.

Figure 12A:
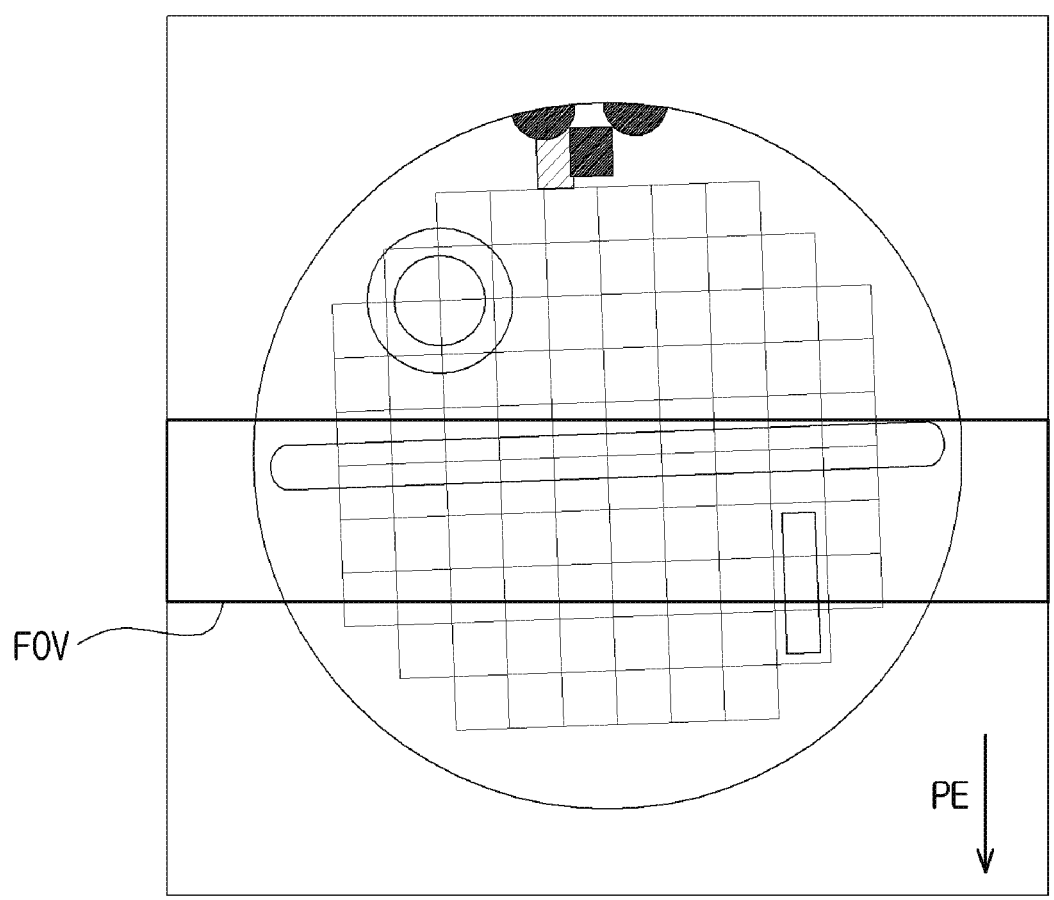
FIGS. 12A and 12B are views illustrating a process of acquiring an image from which aliasing is removed by applying a saturation pulse sequence to a reduced FOV image.
Figure 12B:
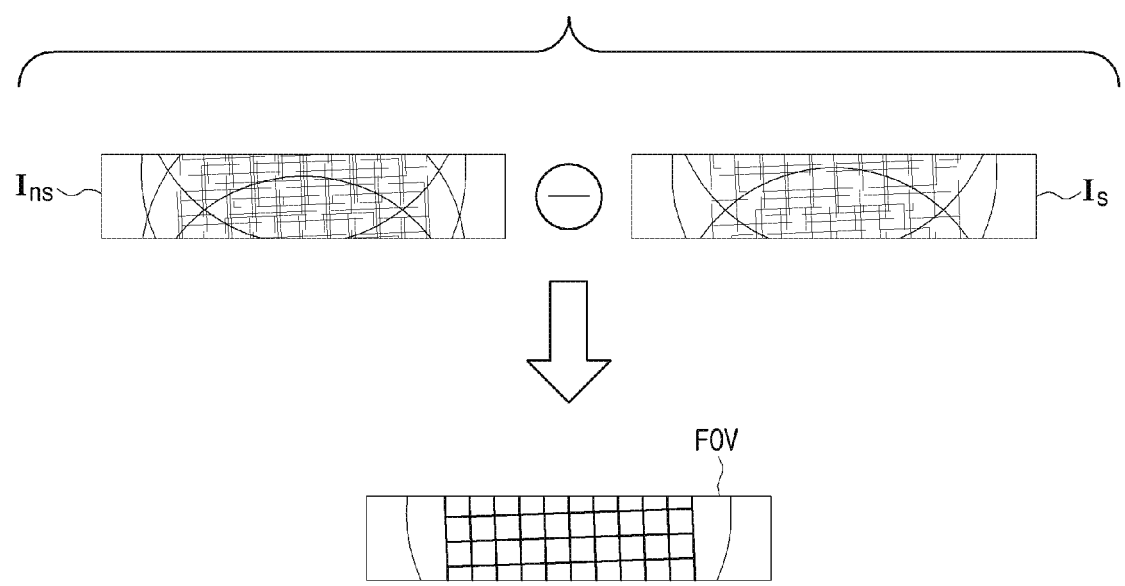

FIGS. 12A and 12B are views illustrating a process of acquiring an image from which aliasing is removed by applying a saturation pulse sequence to a reduced FOV image.

The sequence controller 122 may control the gradient applicator 131 and the RF applicator 132 to reduce a full FOV region as illustrated in FIG. 12A into a region restricted along the phase encoding direction.

In this regard, at least one unsaturated image $I_{ns}$ of the reduced FOV region is generated based on an application of an unsaturation pulse sequence and at least one saturated image $I_s$ of the reduced FOV region is generated based on an application of a saturation pulse sequence as illustrated in FIG. 12B. In this regard, the saturated image $I_s$ is an image in which the magnetic resonance signal is suppressed by saturating the reduced FOV.

Meanwhile, aliasing may occur along the phase encoding direction in the reduced FOV image due to elements outside the reduced FOV region according to reduced FOV imaging. As illustrated in FIG. 12B, aliasing may occur both in the unsaturated image $I_{ns}$ and the saturated image $I_s$.

Since the saturated image $I_s$ is an image obtained by suppressing the magnetic resonance signal by saturating the reduced FOV region, data of only the reduced FOV region from which aliasing is removed may be obtained by a difference image between the unsaturated image $I_{ns}$ and the saturated image $I_s$.

FIG. 13 to FIG. 16 are views illustrating a process of acquiring images of thin slices using saturated images. FIGS. 13 to 16 illustrate volumes viewed in the Y-axial direction.

Referring to FIGS. 13 to 16, the magnetic resonance imaging apparatus 100 may generate images of a first slice, a second slice, a third slice, and a fourth slice $S_1$, $S_2$, $S_3$, and $S_4$ having very small thicknesses in the entire volume $V_f$. The thicknesses of the first slice, the second slice, the third slice, and the fourth slice $S_1$, $S_2$, $S_3$, and $S_4$ may be the same or different.

Figure 13:
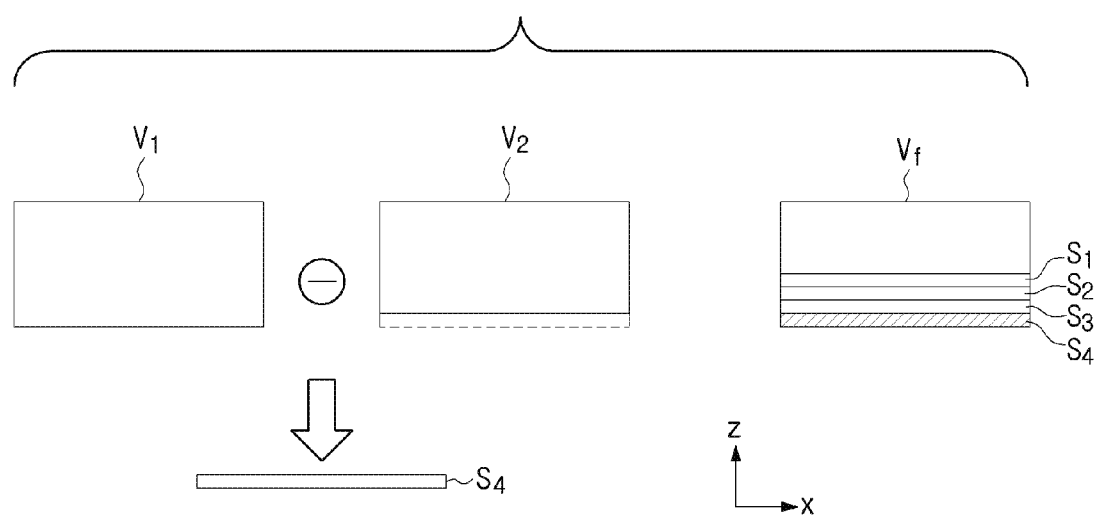
FIG. 13 to FIG. 16 are views illustrating a process of acquiring images of thin slices using saturated images.

The sequence controller 122 may control the gradient applicator 131 and the RF applicator 132 to acquire a sixth image in which the second slice $S_2$, the third slice $S_3$, and the fourth slice $S_4$ are saturated in the entire volume $V_f$ as illustrated in FIG. 13. The sixth image is a saturated volume image acquired by suppressing magnetic resonance signals of the second slice $S_2$, the third slice $S_3$, and the fourth slice $S_4$ and using a magnetic resonance signal of a fourth volume $V_4$ obtained by excluding the second slice $S_2$, the third slice $S_3$, and the fourth slice $S_4$ from the entire volume $V_f$.

Also, a fifth image in which the first slice $S_1$, the second slice $S_2$, the third slice $S_3$, and the fourth slice $S_4$ are saturated in the entire volume $V_f$ may be acquired. The fifth image is a saturated volume image acquired by suppressing magnetic resonance signals of the first slice $S_1$, the second slice $S_2$, the third slice $S_3$, and the fourth slice $S_4$ and using a magnetic resonance signal of a fifth volume $V_5$ obtained by excluding the first slice $S_1$, the second slice $S_2$, the third slice $S_3$, and the fourth slice $S_4$ from the entire volume $V_f$.

Then, the image processor 163 may acquire a difference image between the sixth image and the fifth image based on a subtraction of the fifth image from the sixth image to obtain an image of the first slice $S_1$.

Figure 14:
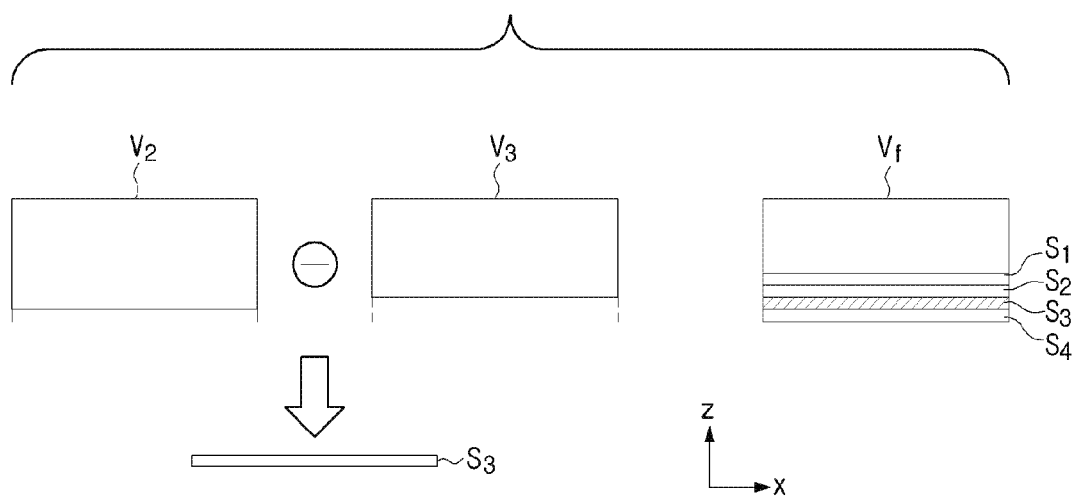

As illustrated in FIG. 14, a seventh image in which the third slice $S_3$ and the fourth slice $S_4$ are saturated in the entire volume $V_f$ may be acquired. The seventh image is a saturated volume image acquired by suppressing magnetic resonance signals of the third slice $S_3$ and the fourth slice $S_4$ and using a magnetic resonance signal of a third volume $V_3$ obtained by excluding the third slice $S_3$ and the fourth slice $S_4$ from the entire volume $V_f$.

Also, the sixth image of the fourth volume $V_4$ may be acquired by saturating the second slice $S_2$, the third slice $S_3$, and the fourth slice $S_4$ in the entire volume $V_f$. Acquisition of the sixth image is as described above with reference to FIG. 13.

Then, a difference image between the seventh image and the sixth image is acquired based on a subtraction of the sixth image from the seventh image to obtain an image of the second slice $S_2$.

Figure 15:
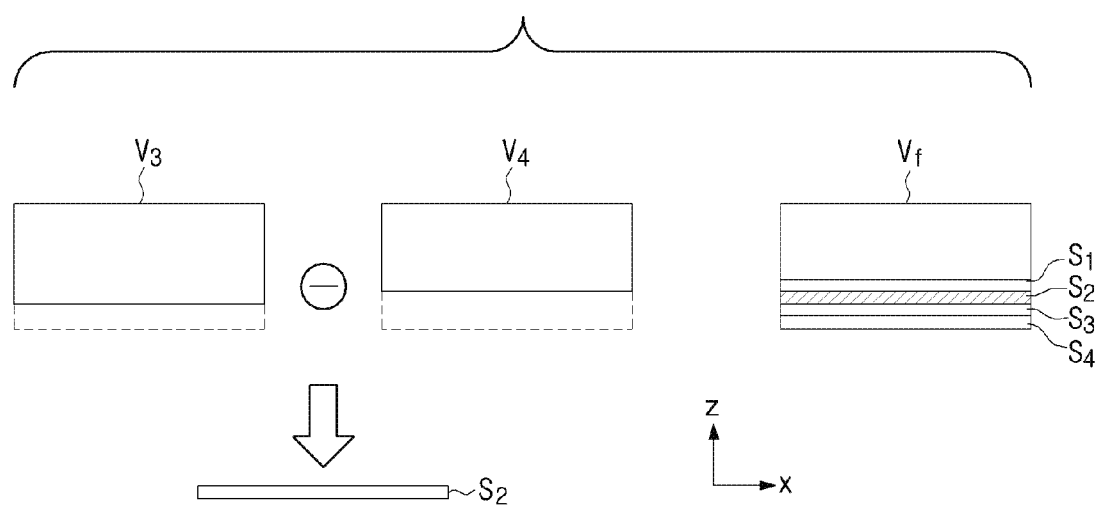

As illustrated in FIG. 15, an eighth image in which the fourth slice $S_4$ is saturated in the entire volume $V_f$ may be acquired. The eighth image is a saturated volume image acquired by suppressing a magnetic resonance signal of the fourth slice $S_4$ and using a magnetic resonance signal of a second volume $V_2$ obtained by excluding the fourth slice $S_4$ form the entire volume $V_f$.

In addition, the seventh image of a third volume $V_3$ may be acquired by saturating the third slice $S_3$ and the fourth slice $S_4$ in the entire volume $V_f$. Acquisition of the seventh image is as described above with reference to FIG. 14.

Then, a difference image between the eighth image and the seventh image may be acquired to obtain an image of the third slice $S_3$.

Figure 16:
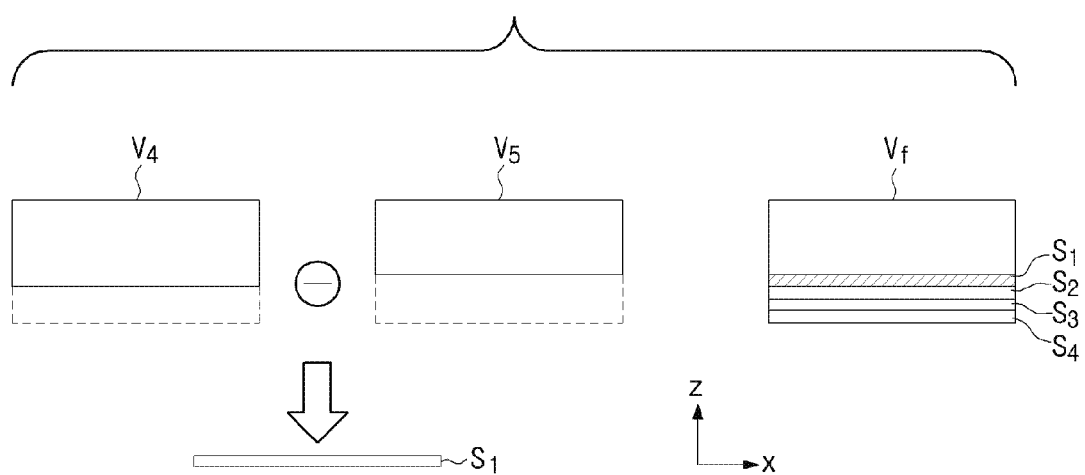

In addition, as illustrated in FIG. 16, a ninth image that is a volume image of the entire volume ($V_1$=$V_f$) and the eighth image in which the fourth slice $S_4$ is saturated in the entire volume are obtained. The ninth image is an unsaturated volume image, and the eighth image is as described above with reference to FIG. 15.

Then, a difference image between the ninth image and the eighth image may be acquired to obtain an image of the fourth slice $S_4$.

According to the aforementioned method, images of slices with a very small thickness, which cannot be obtained by applying general slice selective pulse sequences nor the method of subtracting the saturated image from the unsaturated image described above with reference to FIG. 9, may be acquired.

Particularly, even when the thickness of the first slice $S_1$ or the second slice $S_2$ is too small to be saturated, the image of the first slice $S_1$ or the second slice $S_2$ may be acquired by obtaining a difference image therebetween after acquiring a plurality of saturated volume images in which different regions are saturated as illustrated in FIGS. 13 and 14.

Hereinafter, a method of controlling a magnetic resonance imaging apparatus will be described in detail. The magnetic resonance imaging apparatus described above may also be applied to the method of controlling the magnetic resonance imaging apparatus herein. Thus, descriptions given above with reference to FIGS. 1 to 16 may also be applied to the method of controlling the magnetic resonance imaging apparatus unless otherwise stated.

Figure 17:
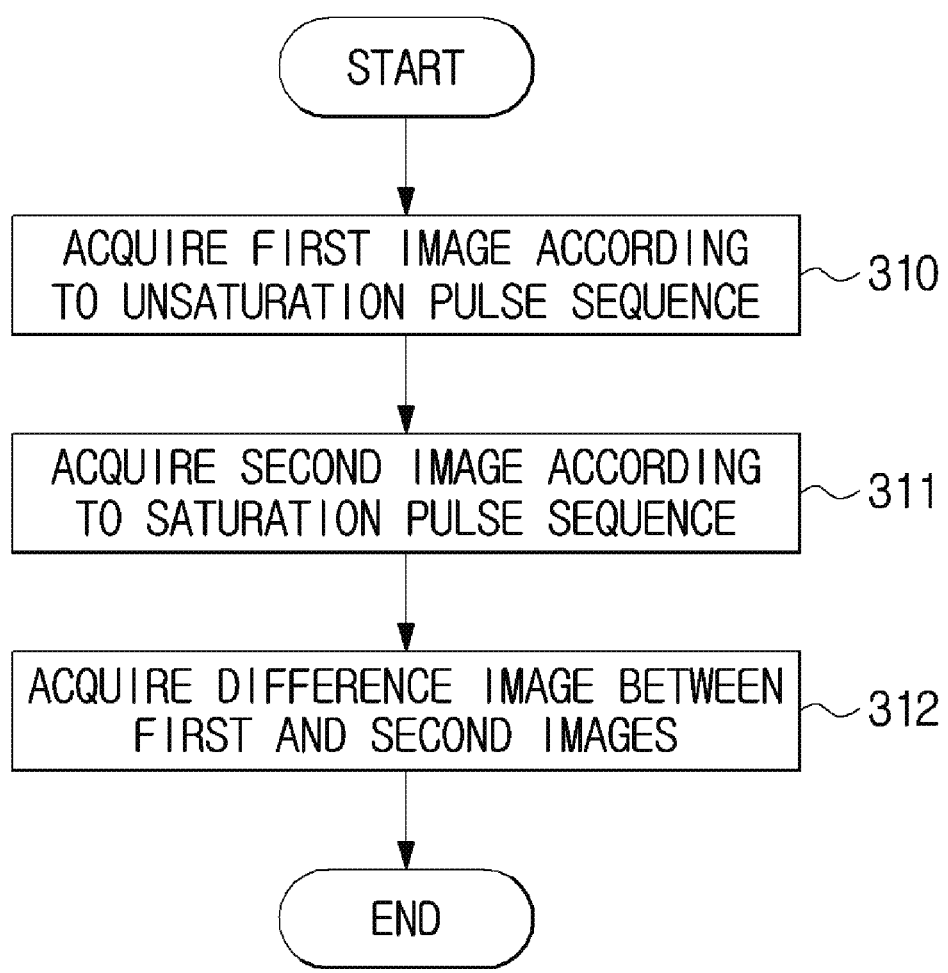
FIG. 17 is a flowchart for describing a method of controlling a magnetic resonance imaging apparatus according to an exemplary embodiment.

FIG. 17 is a flowchart for describing a method of controlling a magnetic resonance imaging apparatus according to an exemplary embodiment.

Referring to FIG. 17, a first image is acquired based on an application of an unsaturation pulse sequence (310). The first image is an unsaturated image in which all FOV regions are not saturated. The first image may be an unsaturated volume image or an unsaturated sectional image.

A second image is acquired based on an application of a saturation pulse sequence (311). The second image is a saturated image in which a magnetic resonance signal is suppressed since an FOV region is partially saturated. The second image may also be a saturated volume image or a saturated sectional image. If the first image is an unsaturated volume image, the second image is a saturated volume image. If the first image is an unsaturated sectional image, the second image is a saturated sectional image.

A difference image between the first image and the second image is acquired (312). For example, the second image may be subtracted from the first image. Based on a subtraction of the second image from the first image, an image of a region saturated in the second image may be obtained.

Although the first image is acquired before acquiring the second image according to the flowchart illustrated in FIG. 17, exemplary embodiments of the method of controlling the magnetic resonance imaging apparatus is not limited thereto. The order of acquiring the first image and the second image is not limited. In the same manner, the order of acquiring images is not limited in the following exemplary embodiments.

Meanwhile, the first image and the second image may be acquired by apply the unsaturation pulse sequence and the saturation pulse sequence respectively to a given volume or a given slice of the object as the sequence controller 122 controls the gradient applicator 131 and the RF applicator 132. Magnetic resonance signals generated in the given volume or the given slice of the object by the unsaturation pulse sequence and the saturation pulse sequence are input to the data collector 161, fill the k-space of the data storage 162, and reconstructed by the image processor 163 as the first image and the second image.

Then, the image processor 163 may acquire a difference image based on a subtraction of the second image from the first image.

Figure 18:
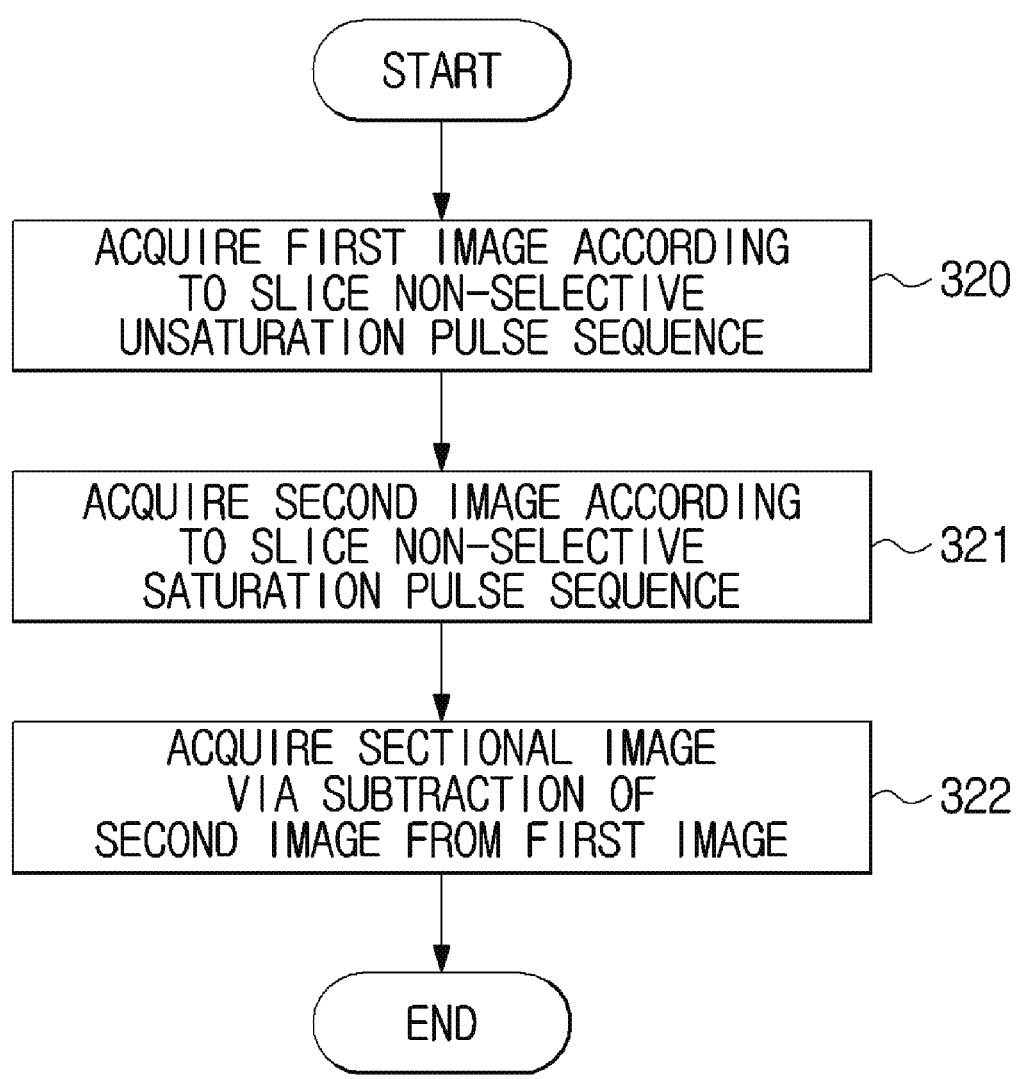
FIGS. 18 and 19 are flowcharts illustrating a method of acquiring a second image using a slice non-selective pulse sequence.
Figure 19:
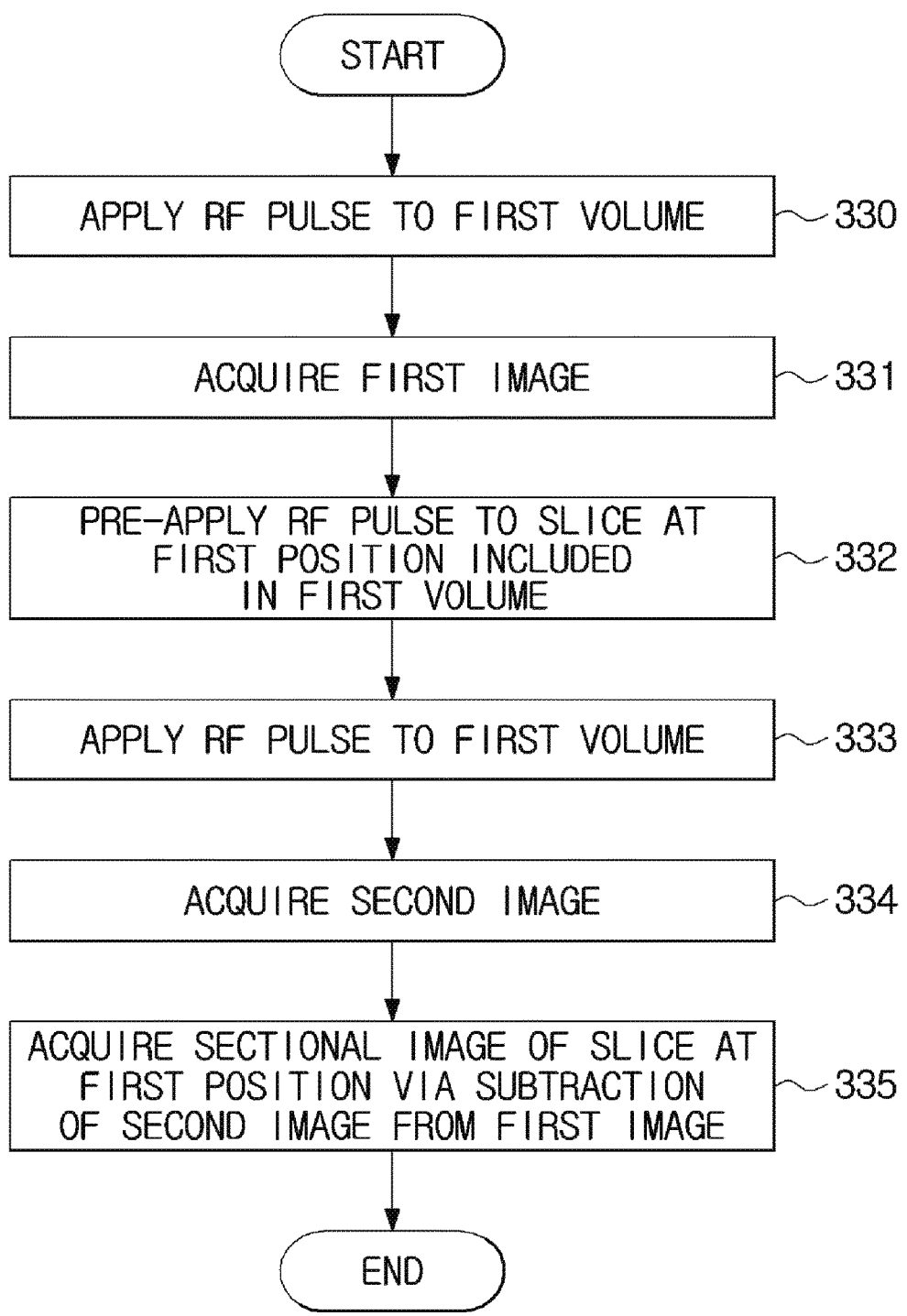

FIGS. 18 and 19 are flowcharts illustrating a method of acquiring a second image using a slice non-selective pulse sequence.

Referring to FIG. 18, a first image is acquired by a slice non-selective unsaturation pulse sequence (320). In this regard, the first image is an unsaturated volume image, i.e., a volume image including no saturated region. To this end, a slice non-selective unsaturation pulse may be applied to a given volume.

A second image is acquired by a slice non-selective saturation pulse sequence (321). In this regard, the second image is a saturated volume image, i.e., a volume image including a saturated region and may have the same FOV as the first image.

After acquiring the first image and the second image, a sectional image may be acquired based on a subtraction of the second image from the first image (322). The first image is an unsaturated volume image of the same FOV as the second image, and the second image is a saturated volume image in which a magnetic resonance signal of a given region is suppressed. Thus, if the saturated given region is a slice, the sectional image of the saturated slice may be acquired based on a subtraction of the second image from the first image.

This will be described in more detail with reference to FIG. 19.

Referring to FIG. 19, the first image is acquired (331) by applying an RF pulse to a first volume (330). In this regard, the applied RF pulse follows a slice on-selective unsaturation pulse sequence. by the slice non-selective unsaturation pulse sequence. For example, a silent sequence in which the magnitude of a gradient field to select a slice does not rapidly change but gradually changes. The first image is a volume image of the first volume.

The RF pulse is pre-applied to a slice located at a first position included in the first volume (332). Since the slice located at the first position to which the RF pulse is pre-applied is not magnetized or magnetization thereof is considerably attenuated by a next RF pulse, generation of a magnetic resonance signal is suppressed.

A second image is acquired (334) by applying an RF pulse to the first volume (333). In this case, the RF pulse is applied the entire first volume including the slice located at the first position, and the same slice non-selective pulse sequence as that used in operation 330 may be used. Since generation of the magnetic resonance signal is suppressed in the slice located at the first position, the second image includes data about the other regions of the first volume except for the slice of the first position.

A sectional image of the slice at the first position is acquired based on a subtraction of the second image from the first image (335). Since the first image includes data about the entire first volume, and the second image includes data of only the other regions of the first volume except for the slice located at the first position, the sectional image of the slice at the first location may be acquired based on a subtraction of the second image from the first image. That is, according to the embodiment illustrated in FIGS. 18 and 19, a sectional image of a desired slice may be acquired even when the slice non-selective pulse sequence is used. In addition, sectional images of slices with a very small thickness, which cannot be obtained by applying general slice selective pulse sequences, may also be obtained thereby.

In addition, even when a desired slice is too thin to be selectively saturated, a sectional image of the desired slice may be acquired using a difference image between two saturated volume images by acquiring a plurality of saturated volume images in which different regions are saturated and adjusting a difference between two saturated volume images to correspond to the desired slice.

Figure 20:
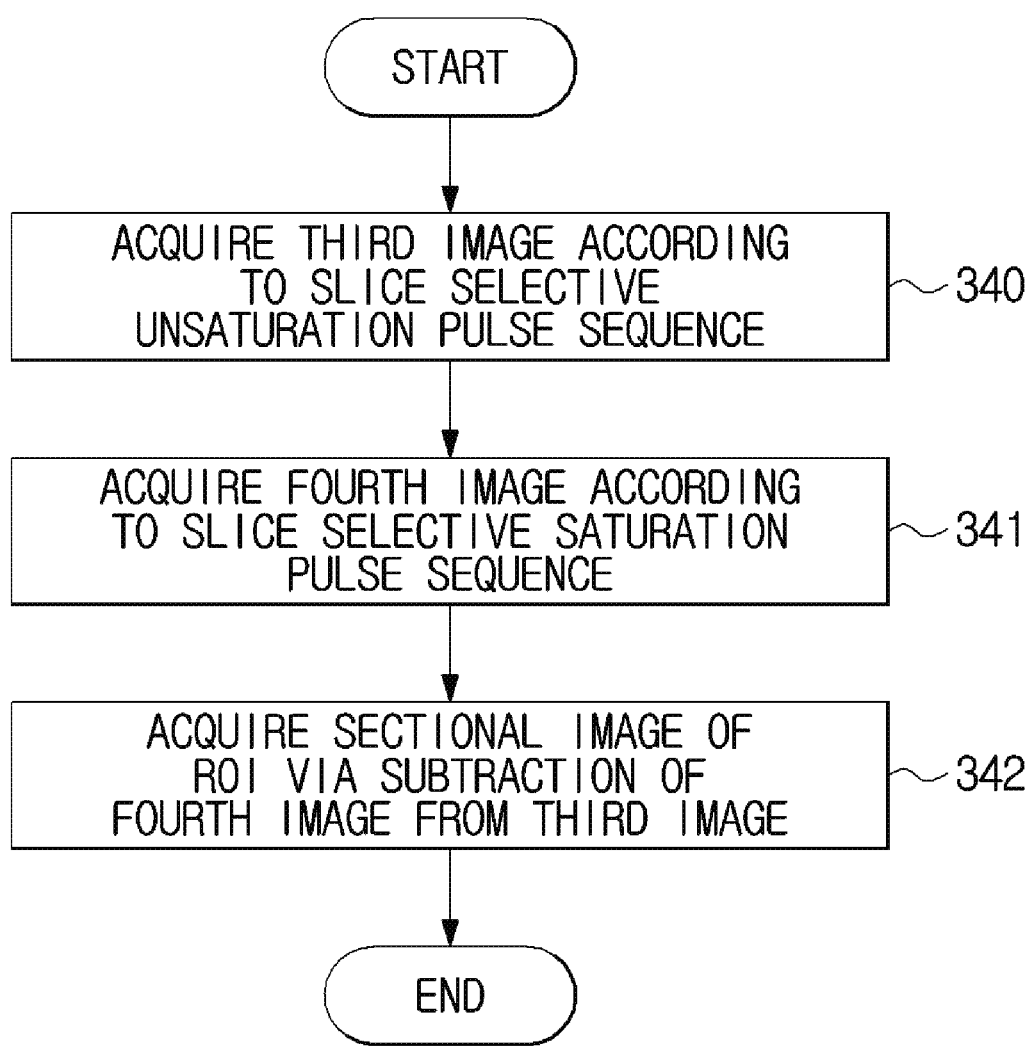
FIGS. 20 and 21 are flowcharts for describing a method of extracting an ROI from a slice.
Figure 21:
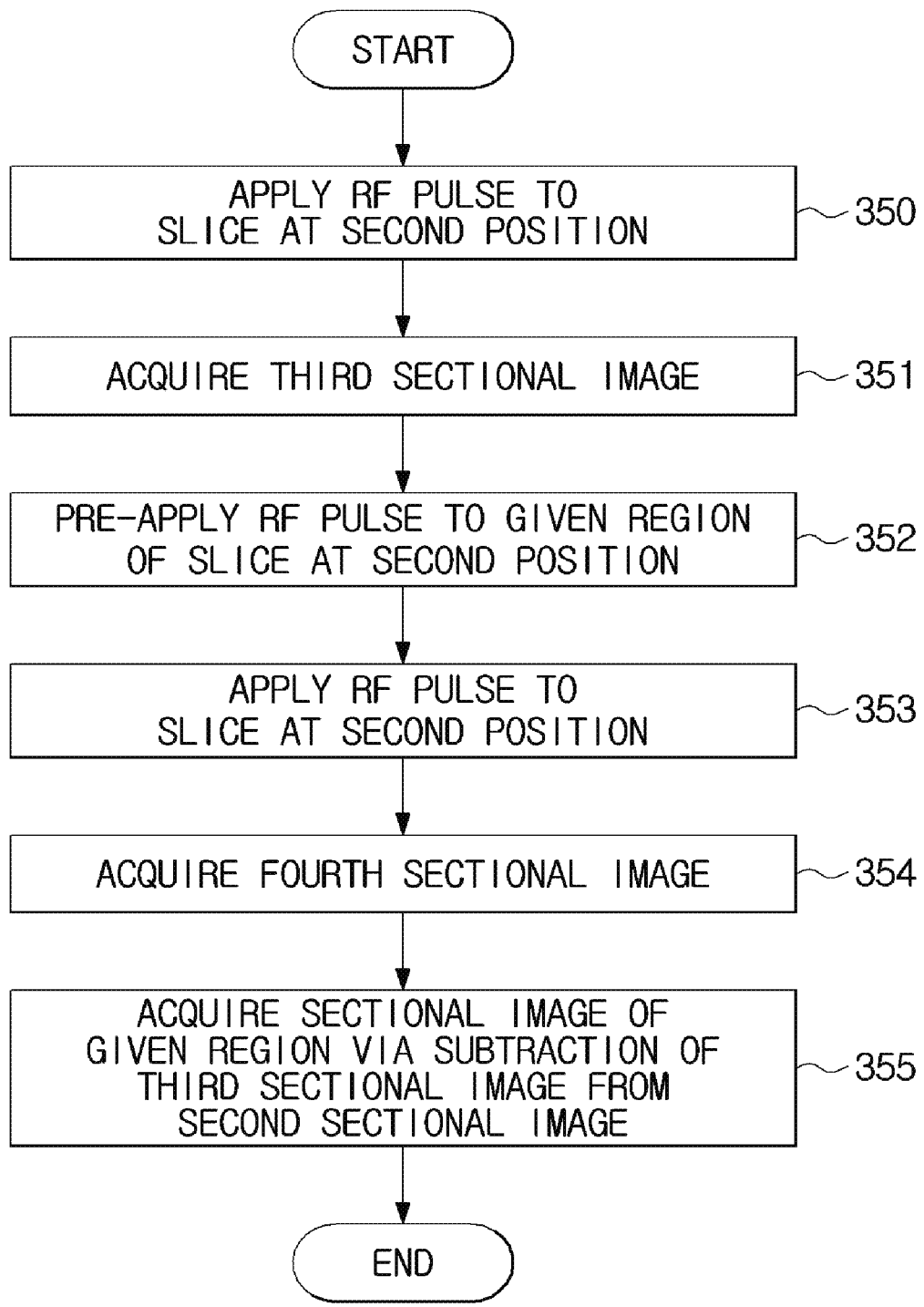

FIGS. 20 and 21 are flowcharts for describing a method of extracting an ROI from a slice.

Referring to FIG. 20, a third image is acquired according to a slice selective unsaturation pulse sequence (340). The third image is a sectional image of a given slice, and the slice selective unsaturation pulse sequence may be selected from various pulse sequences such as a gradient pulse sequence and a spin echo pulse sequence.

A fourth image is acquired according to a slice selective saturation pulse sequence (341). The fourth image is a sectional image of the same slice as that of the third image in which generation of a magnetic resonance signal of a given region in the slice is suppressed since the saturation pulse sequence is used. For example, generation of the magnetic resonance signal may be suppressed by saturating an ROI of the user.

A sectional image of the ROI may be acquired based on a subtraction of the fourth image from the third image (342). Since the third image is an unsaturated sectional image of the same FOV as that of the fourth image, and the fourth image is a saturated sectional image in which the magnetic resonance signal of the ROI in the FOV is suppressed, a sectional image of the extracted saturated ROI may be acquired based on a subtraction of the fourth image from the third image.

This will be described in more detail with reference to FIG. 21.

Referring to FIG. 21, the third image is acquired (351) by applying an RF pulse to the slice located at a second position (350). Although the slice located at the second position is distinguished from the slice located at the first position described above, the second position is not necessarily different from the first position. Thus, the slice of the second position may be located at the same position as or at a different position from the slice of the first position. The RF pulse applied herein is a slice selective pulse sequence and may be selected from various pulse sequences such as the gradient pulse sequence and the spin echo pulse sequence as described above.

The RF pulse is pre-applied to a given region of the slice of the second position (352). In this regard, the given region may be an ROI. The ROI to which the RF pulse is pre-applied may not be magnetized or magnetization thereof may be considerably attenuated, and thus generation of the magnetic resonance signal may be suppressed.

Meanwhile, the ROI in the slice may have a region restricted in the phase encoding direction or a region restricted in the phase encoding direction and the frequency encoding direction.

The fourth image is acquired (354) by applying an RF pulse to the slice of the second position (353). In this case, the RF pulse is applied to the entire slice of the second position including the ROI, and thus the same sequence as the slice selective pulse sequence used in operation 350 may be used. Since the ROI to which the RF pulse is pre-applied is saturated and generation of the magnetic resonance signal is suppressed therein, the fourth image includes data about the other regions of the slice located at the second position except for the ROI.

The sectional image of the ROI is acquired based on a subtraction of the fourth image from the third image (355). Since the third image includes data about the entire slice of the second position, and the fourth image includes data about the other regions of the second position except for the ROI, a sectional image of the extracted ROI may be acquired based on a subtraction of the fourth image from the third image.

Figure 22:
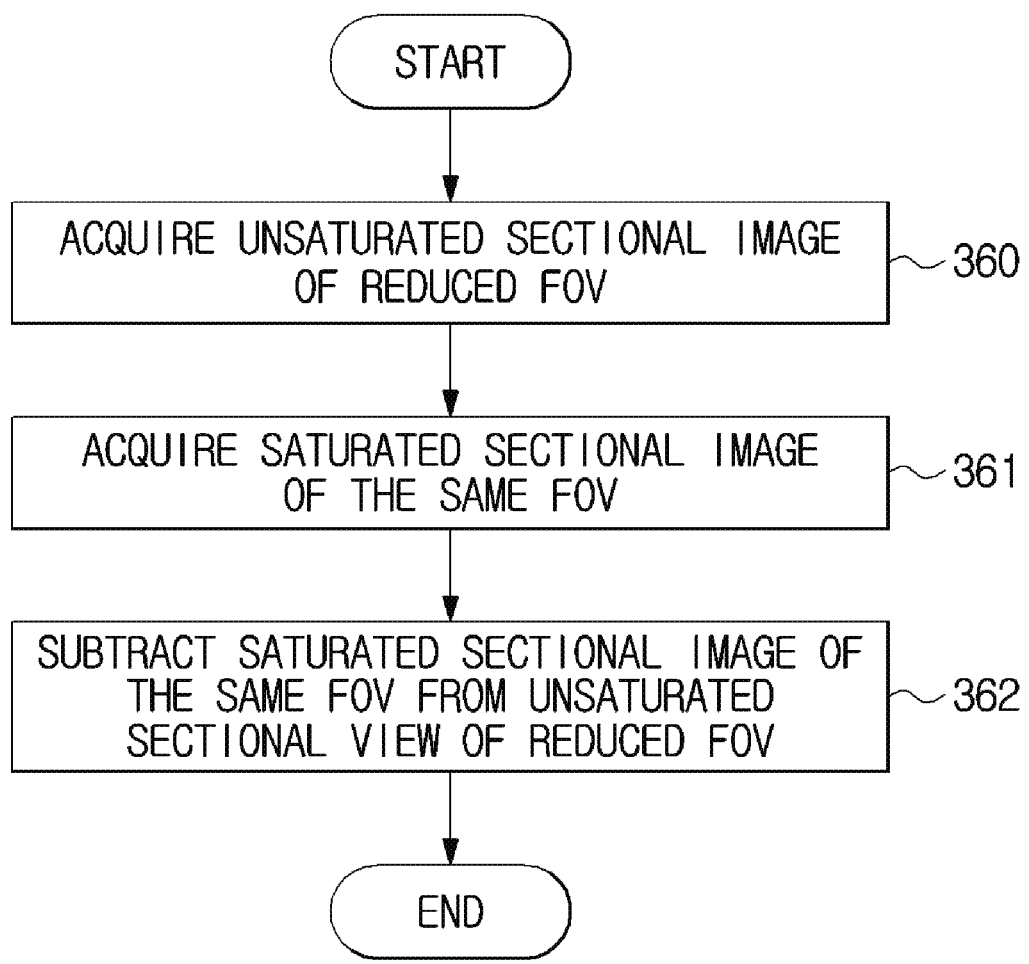
FIG. 22 is a flowchart for describing a process of removing aliasing from a reduced FOV image.

FIG. 22 is a flowchart for describing a process of removing aliasing from a reduced FOV image.

Referring to FIG. 22, an unsaturated sectional image of a reduced FOV region is acquired (360). To this end, the sequence controller 122 may control the gradient applicator 131 and the RF applicator 132 to reduce a full FOV region into a region restricted along the phase encoding direction. In this case, an unsaturation pulse sequence is used.

A saturated sectional image of the same FOV region is acquired (361). To this end, the sequence controller 122 may control the gradient applicator 131 and the RF applicator 132 to apply a saturation pulse sequence to the reduced FOV region. When the saturation pulse sequence is used in the reduced FOV region, the reduced FOV region is saturated and generation of a magnetic resonance signal may be suppressed in this region.

In reduced FOV imaging, aliasing may occur in the reduced ROV region along the phase encoding direction due to external elements of the reduced FOV region. Thus, aliasing may be caused in both the unsaturated sectional image and the saturated sectional image of the reduced FOV region.

The saturated sectional image of the reduced FOV region is subtracted from the unsaturated sectional image of the same FOV region (362). Since aliasing occurs in both the unsaturated sectional image and the saturated sectional image of the reduced FOV region, and the saturated sectional image does not include data about the reduced FOV region, a sectional image of the reduced FOV region from which aliasing is removed may be acquired using a difference image between the two images.

According to the magnetic resonance imaging apparatus and the method of controlling the same as described above, a sectional image of the object may be acquired and a sectional image of a reduced FOV region from which aliasing is removed may be acquired using a saturation pulse sequence to suppress the magnetic resonance signal of a given position.

Meanwhile, the expressions "the first image to the ninth image", "the first volume", "the first position", "the first slice to the fourth slice", etc., are used to distinguish one from a plurality of images, positions, slices, volumes or given positions. Thus, exemplary embodiments of the magnetic resonance imaging apparatus and the method of controlling the same are not limited to these expressions. Throughout the specification, elements expressed as the same ordinal number in different examples do not necessarily have the same meaning, and those expressed as different ordinal numbers do not necessarily have different meanings.

In the same manner, elements expressed as different ordinal numbers in the specification and the claims may have the same meaning, and those expressed as the same ordinal number may have different meanings. In other words, the elements need to be understood based on the context thereof, respectively.

As the exemplary embodiments may be implemented in several forms without departing from the characteristics thereof, it should also be understood that the above-described exemplary embodiments are not limited by any of the details of the foregoing description, unless otherwise specified, but rather should be construed broadly within its scope as defined in the appended claims. Therefore, various changes and modifications that fall within the scope of the claims, or equivalents of such scope are therefore intended to be embraced by the appended claims.

The terms used in the present specification are merely used to describe particular exemplary embodiments, and are not intended to limit the present disclosure. An expression used in the singular encompasses the expression of the plural, unless it has a clearly different meaning in the context. Throughout the specification, it is to be understood that the terms such as "including" or "having", etc., are intended to indicate the existence of the features, numbers, operations, components, parts, or combinations thereof disclosed in the specification, and are not intended to preclude the possibility that one or more other features, numbers, operations, components, parts, or combinations thereof may exist or may be added.

Also, as used herein, the terms "unit", "device", "block", "member", and "module" refer to a unit used to perform at least one operation or function.

As is apparent from the above description, according to the magnetic resonance imaging apparatus and the method of controlling the same, a sectional image of the object may be acquired and an image of a reduced FOV form which aliasing is removed may be acquired by using a saturation pulse sequence that suppresses a magnetic resonance signal of the given position.

Although a few exemplary embodiments of the present disclosure have been shown and described, it would be appreciated by those skilled in the art that changes may be made in these exemplary embodiments without departing from the principles and spirit of the disclosure, the scope of which is defined in the claims and their equivalents.

What is claimed is:

1. A magnetic resonance imaging apparatus comprising:
   a scanner comprising:
      a first coil assembly configured to form a static magnetic field in a bore;
      a second coil assembly configured to apply a gradient to the static magnetic field that is formed; and
      a third coil assembly configured to apply radio frequency (RF) pulse to an object that is located in the bore;
   a sequence controller configured to control the scanner to:
      apply, to a first region of the object, an unsaturation pulse sequence in which any pre-application of the RF pulse is not included; and
      apply a saturation pulse sequence to the first region of the object; and
   a data processor configured to:
      acquire a first image by receiving a first magnetic resonance signal from the first region of the object to which the unsaturation pulse sequence is applied;
      acquire a second image by receiving a second magnetic resonance signal from the first region of the object to which the saturation pulse sequence is applied; and
      obtain a difference image, based on a difference between the first image and the second image.

2. The magnetic resonance imaging apparatus according to claim 1, wherein the sequence controller is further configured to control the scanner to saturate at least one region in the first region of the object, based on an application of the saturation pulse sequence.

3. The magnetic resonance imaging apparatus according to claim 2, wherein the sequence controller is further configured to control the scanner to suppress generation of a magnetic resonance signal in the at least one region by pre-applying the RF pulse to the at least one region.

4. The magnetic resonance imaging apparatus according to claim 1, wherein the first region comprises a volume in the object, and
   the unsaturation pulse sequence and the saturation pulse sequence are slice non-selective sequences.

5. The magnetic resonance imaging apparatus according to claim 4, wherein the sequence controller is further configured to control the scanner to saturate at least one slice region in the volume, based on an application of the saturation pulse sequence.

6. The magnetic resonance imaging apparatus according to claim 5, wherein the data processor is further configured to acquire a section image of the at least one slice region that is saturated, based on a subtraction of the second image from the first image.

7. The magnetic resonance imaging apparatus according to claim 1, wherein the first region corresponds to a slice in the object, and
   the unsaturation pulse sequence and the saturation pulse sequence are slice selective sequences.

8. The magnetic resonance imaging apparatus according to claim 7, wherein the sequence controller is further configured to control the scanner to saturate at least one region of interest (ROI) in the slice, based on an application of the saturation pulse sequence.

9. The magnetic resonance imaging apparatus according to claim 8, wherein the data processor is further configured to extract the at least one ROI that is saturated, based on a subtraction of the second image from the first image.

10. The magnetic resonance imaging apparatus according to claim 1, wherein the first region corresponds to a reduced Field of View (FOV).

11. The magnetic resonance imaging apparatus according to claim 10, wherein the sequence controller is further configured to control the scanner to saturate the reduced FOV, based on an application of the saturation pulse sequence.

12. The magnetic resonance imaging apparatus according to claim 11, wherein the data processor is further configured to acquire an image of the reduced FOV from which aliasing is removed, based on a subtraction of the second image from the first image.

13. A method of controlling a magnetic resonance imaging apparatus, the method comprising:
   applying, to a first region of an object, an unsaturation pulse sequence in which any pre-application of a radio frequency (RF) pulse is not included;
   applying a saturation pulse sequence to the first region of the object;
   acquiring a first image by receiving a first magnetic resonance signal from the first region of the object to which the unsaturation pulse sequence is applied;

acquiring a second image by receiving a second magnetic resonance signal from the first region of the object to which the saturation pulse sequence is applied; and obtaining a difference image, based on a difference between the first image and the second image.

14. The method according to claim 13, wherein the acquiring of the second image comprises saturating at least one region in the first region of the object, based on an application of the saturation pulse sequence.

15. The method according to claim 14, wherein the saturating of the at least one region in the first region of the object comprises suppressing generation of a magnetic resonance signal in the at least one region by pre-applying the RF pulse to the at least one region.

16. The method according to claim 13, wherein the first region comprises a volume in the object, and the unsaturation pulse sequence and the saturation pulse sequence are slice non-selective sequences.

17. The method according to claim 16, wherein the acquiring of the second image comprises saturating at least one slice region in the volume, based on an application of the saturation pulse sequence.

18. The method according to claim 17, wherein the acquiring of the second image comprises:

pre-applying the RF pulse to the at least one slice region; and applying the RF pulse to the entire volume.

19. The method according to claim 17, wherein the obtaining of the difference image comprises acquiring a section image of the at least one slice region that is saturated, based on a subtraction of the second image from the first image.

20. The method according to claim 13, wherein the first region corresponds to a slice in the object, and the unsaturation pulse sequence and the saturation pulse sequence are slice selective sequences.

21. The method according to claim 20, wherein the acquiring of the second image comprises saturating at least one region of interest (ROI) in the slice, based on an application of the saturation pulse sequence.

* * * * *